(12) United States Patent
Senga et al.

(10) Patent No.: US 7,085,297 B2
(45) Date of Patent: Aug. 1, 2006

(54) DRIVING METHOD AND DRIVING CIRCUIT OF LIGHT SOURCE APPARATUS

(75) Inventors: Hisashi Senga, Osaka (JP); Hiromichi Ishibashi, Osaka (JP); Shigeru Furumiya, Hyogo (JP); Ken'ichi Kasazumi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 289 days.

(21) Appl. No.: 10/826,313

(22) Filed: Apr. 19, 2004

(65) Prior Publication Data

US 2004/0264525 A1 Dec. 30, 2004

(30) Foreign Application Priority Data

Apr. 22, 2003 (JP) ............................ P2003-116837

(51) Int. Cl.
*H01S 3/00* (2006.01)
*G02B 6/00* (2006.01)
(52) U.S. Cl. .............................. 372/38.07; 372/29.015; 372/29.016; 372/29.023; 372/38.02; 372/33; 372/34; 372/38.1
(58) Field of Classification Search ........... 372/29.015, 372/29.016, 29.023, 38.02, 38.07, 33, 34
See application file for complete search history.

(56) References Cited

U.S. PATENT DOCUMENTS

| 5,926,497 A * | 7/1999 | Nitta et al. .................... 372/96 |
| 6,642,952 B1 * | 11/2003 | Furumiya et al. ............. 347/247 |
| 6,738,398 B1 * | 5/2004 | Hirata et al. ................... 372/32 |
| 7,010,006 B1 * | 3/2006 | Kasazumi et al. ......... 372/29.02 |
| 2002/0044197 A1 * | 4/2002 | Furumiya et al. ............ 347/247 |
| 2004/0066807 A1 * | 4/2004 | Kasazumi et al. .............. 372/22 |
| 2004/0257940 A1 * | 12/2004 | Senga et al. .............. 369/47.26 |
| 2005/0069002 A1 * | 3/2005 | Senga et al. .............. 372/38.01 |
| 2005/0105569 A1 * | 5/2005 | Senga et al. ............ 372/29.021 |

FOREIGN PATENT DOCUMENTS

JP 2001-326418 11/2001

OTHER PUBLICATIONS

English Language Abstract of JP 2001-326418.
Yamamoto et al., "Milliwatt-order blue-light generation in a periodically domain-inverted $LiTaO_3$ waveguide", Optics Letters, vol. 16, No. 15, pp. 1156-1158 (Aug. 1, 1991).

* cited by examiner

Primary Examiner—Minsun Harvey
Assistant Examiner—Hrayr A. Sayadian
(74) Attorney, Agent, or Firm—Greenblum &Bernstein, P.L.C.

(57) ABSTRACT

A driving method of a semiconductor laser having an active layer region, a phase adjustment region and a distributed Bragg reflector region includes the steps of: calculating an average value of multipulse modulation currents modulated between a peak current and a bottom current input to said active layer region; calculating a difference between the average value of the multipulse modulation currents and a bias current input to the active layer region; and applying a first compensation current to the phase adjustment region when the multipulse modulation current is input to the active layer region, and applying a second compensation current corresponding to the difference to the phase adjustment region when the bias current is input to the active layer region.

10 Claims, 18 Drawing Sheets

INPUT CURRENT TO
ACTIVE LAYER
REGION

INPUT CURRENT TO
PHASE ADJUSTMENT
REGION

Iop

Δλop

Δλph1

Δλph2

Δλph

Fig. 11A
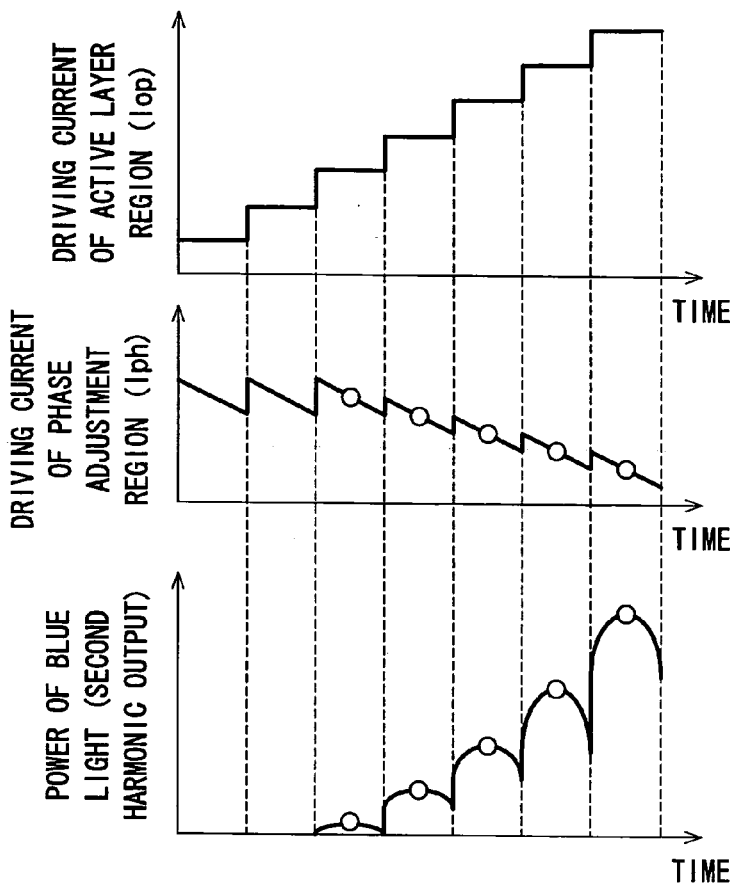
Fig. 11B
Fig. 11C
Fig. 11D
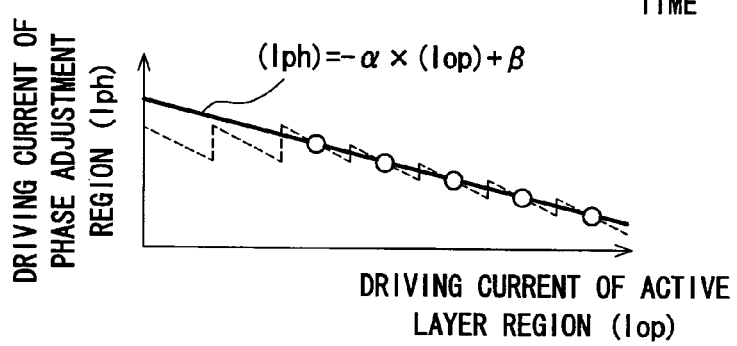
$(Iph) = -\alpha \times (Iop) + \beta$
Fig. 11E
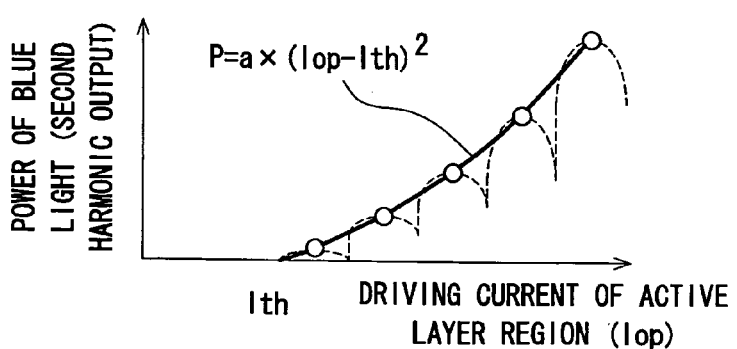
$P = a \times (Iop - Ith)^2$

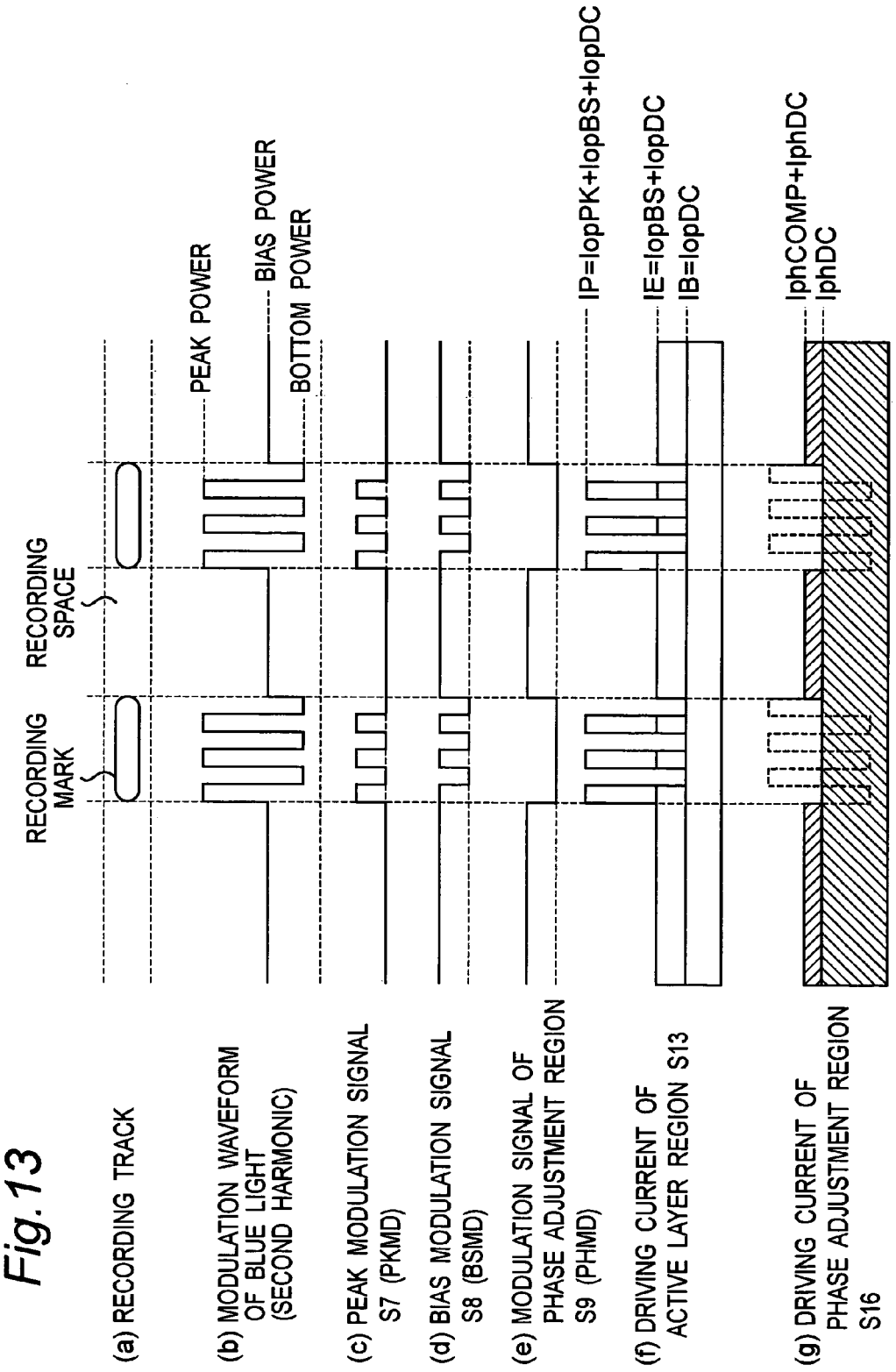

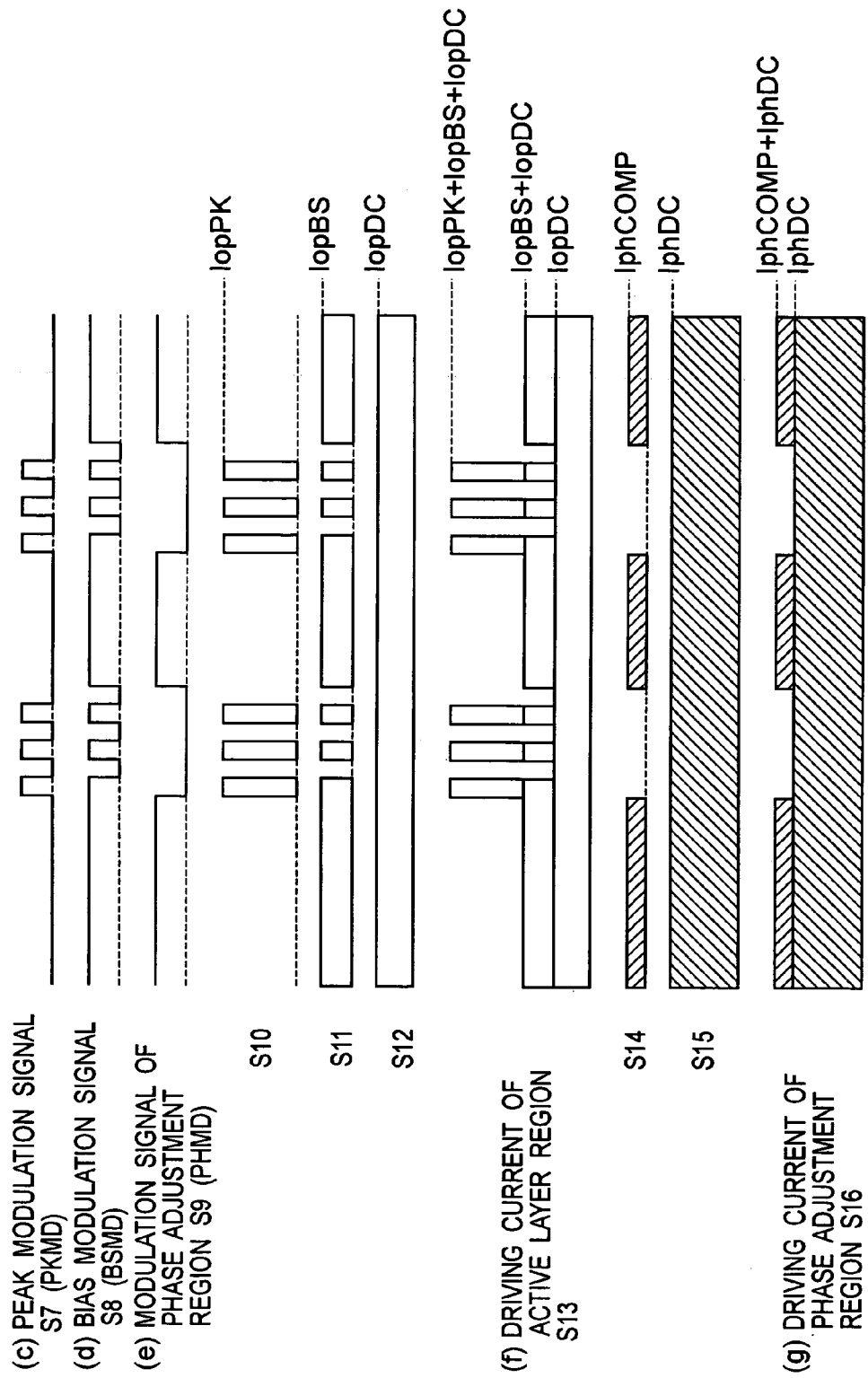

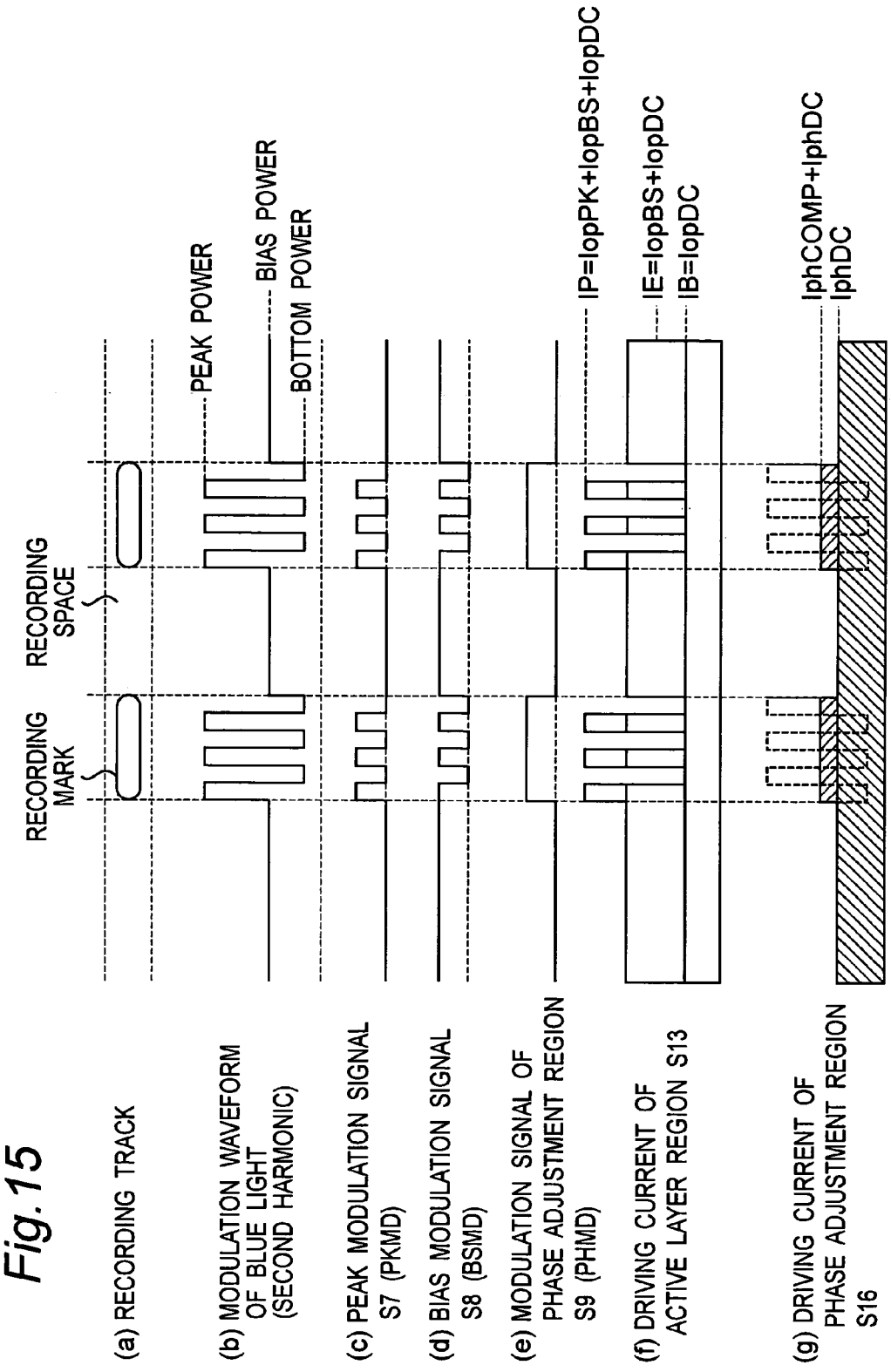

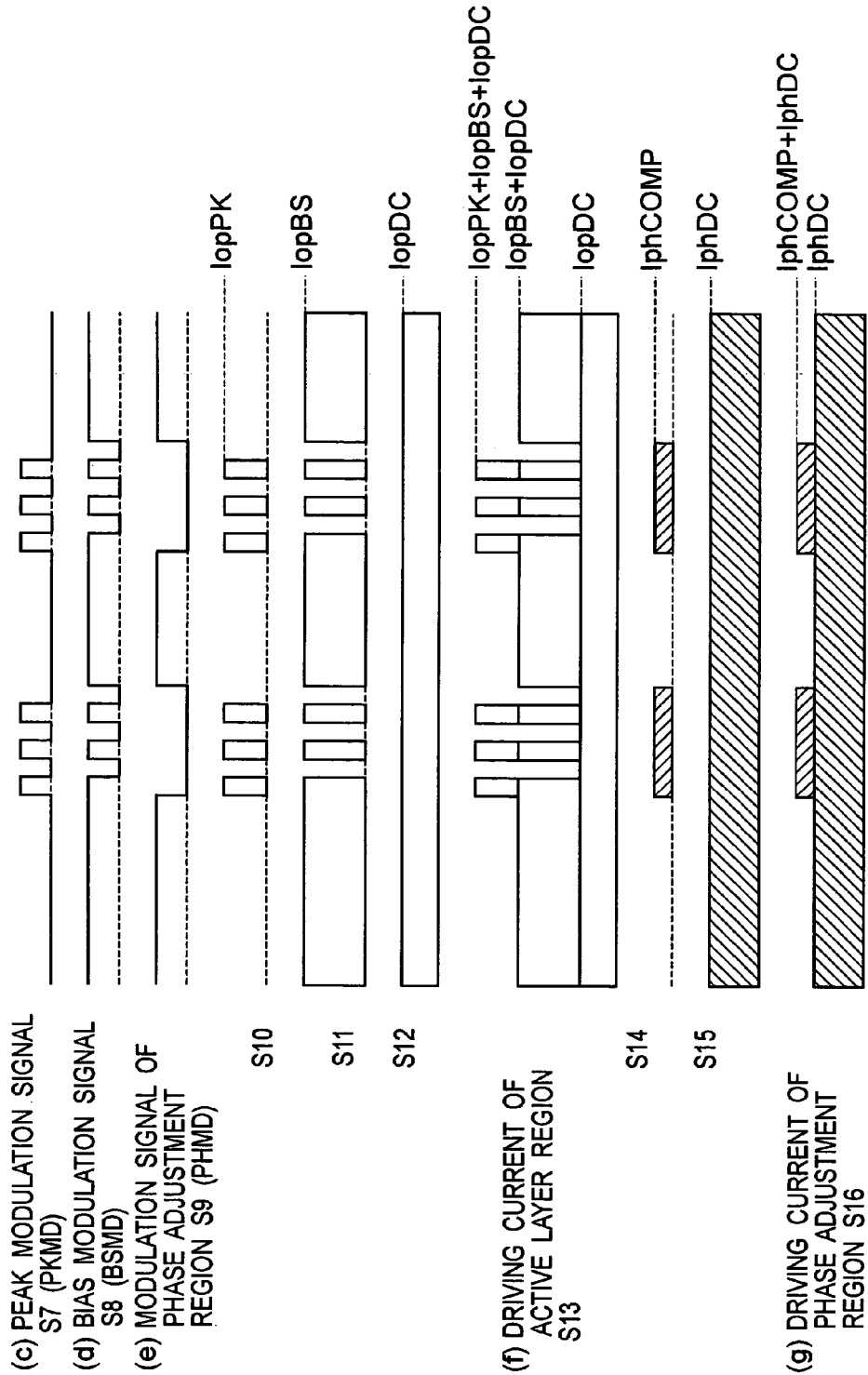

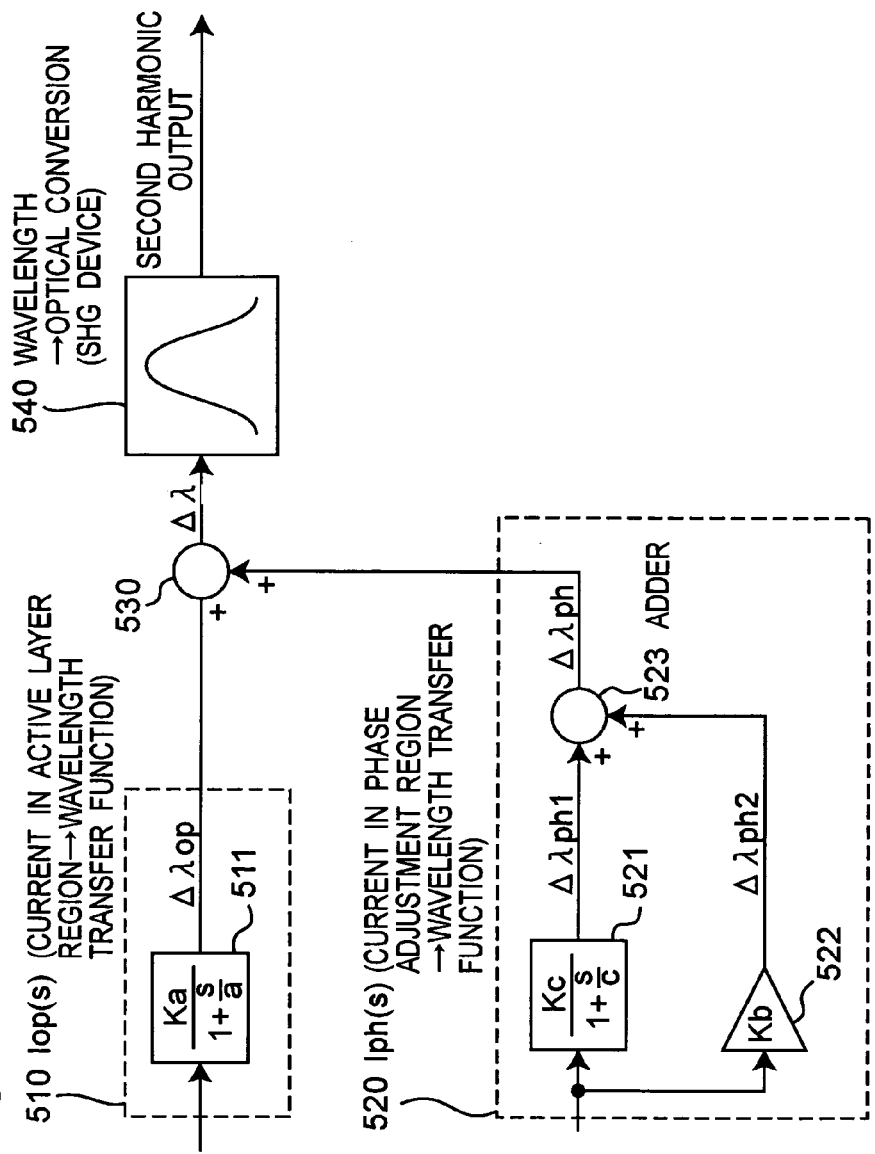
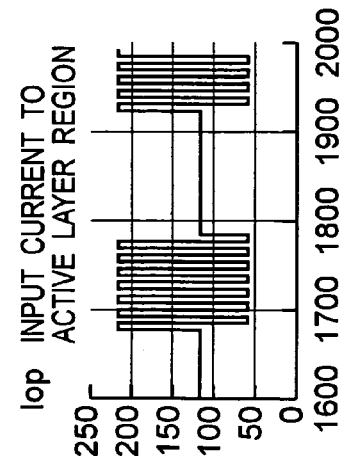
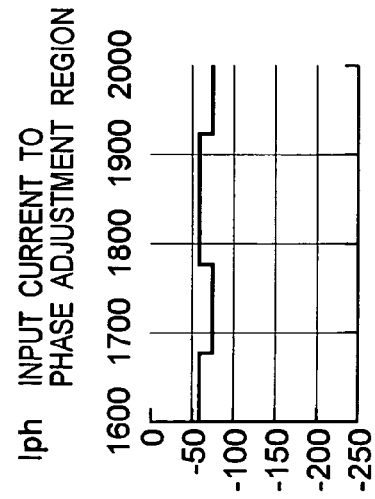

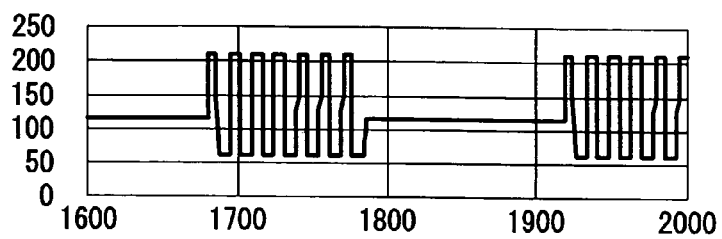
Fig. 18A  Iop
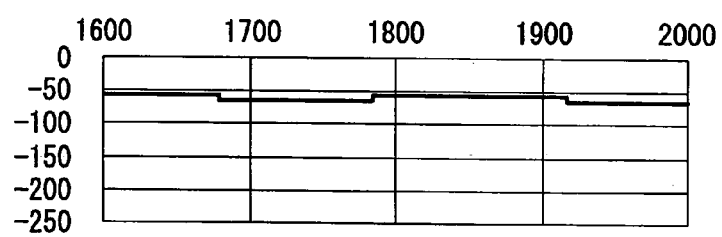
Fig. 18B  Iph
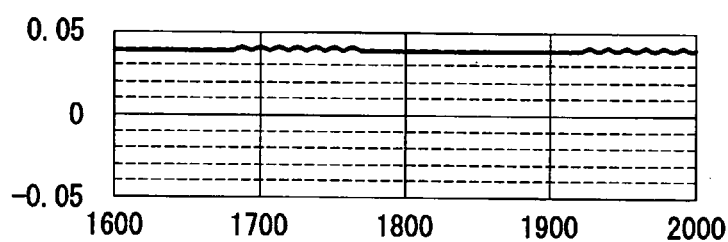
Fig. 18C  $\Delta\lambda$op
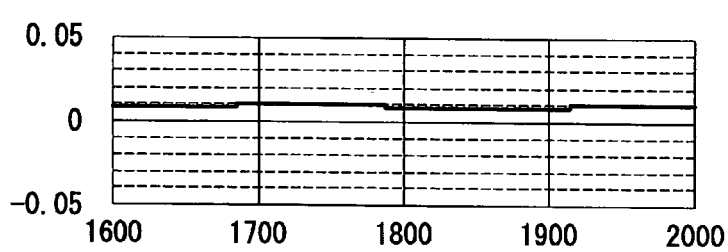
Fig. 18D  $\Delta\lambda$ph1
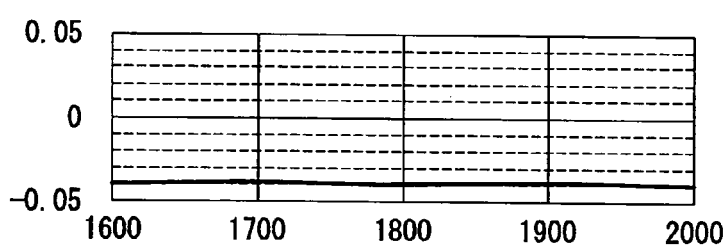
Fig. 18E  $\Delta\lambda$ph2
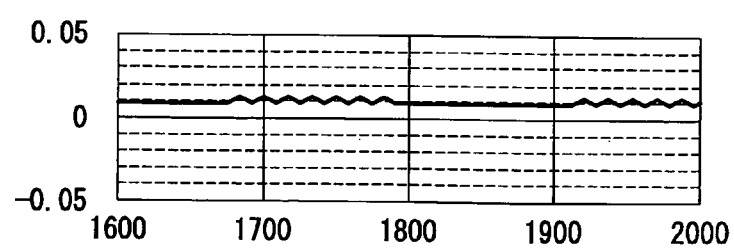
Fig. 18F  $\Delta\lambda$ph

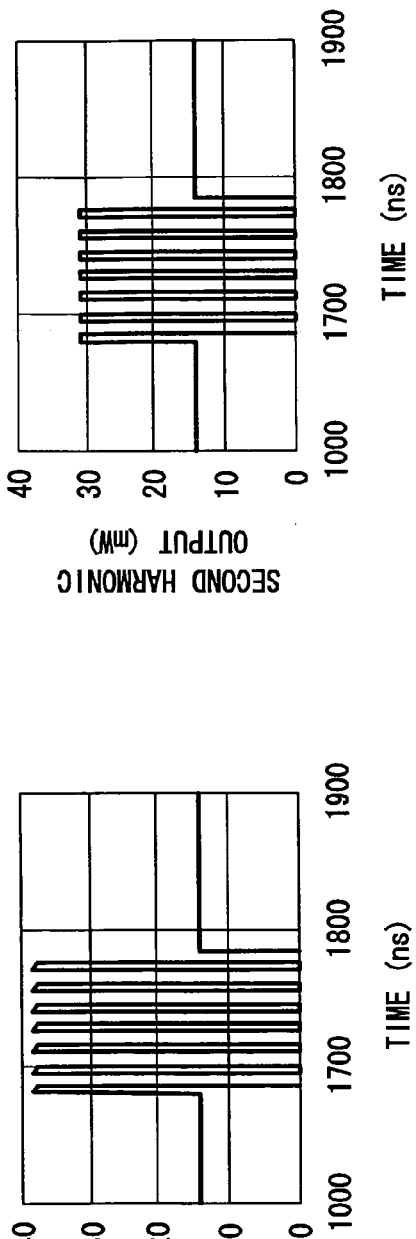
Fig. 19A
Fig. 19B
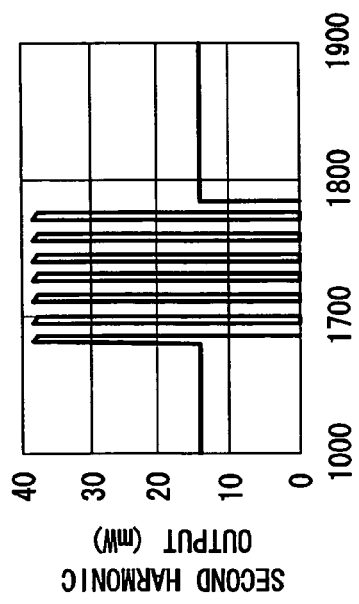
Fig. 19C
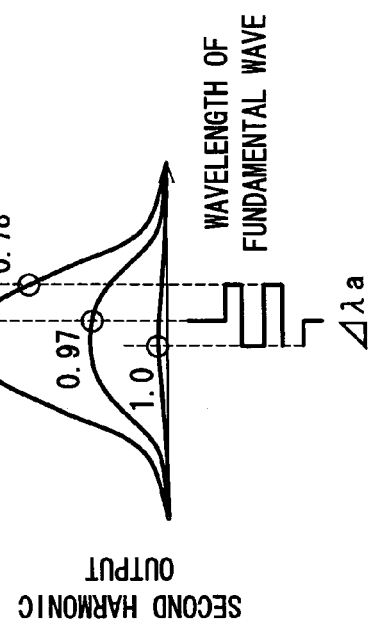
Fig. 19D
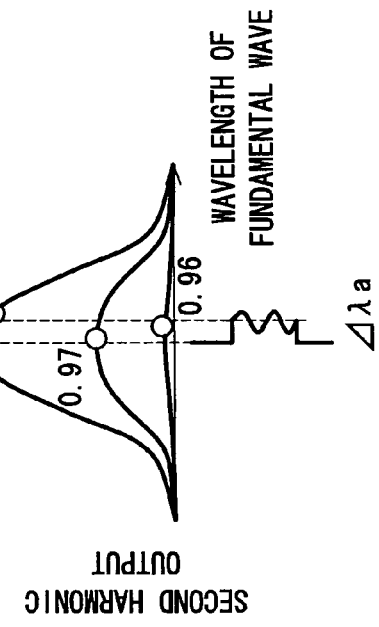

DRIVING METHOD AND DRIVING CIRCUIT OF LIGHT SOURCE APPARATUS

BACKGROUND OF THE INVENTION

1. Field of the Invention

The present invention relates to a driving method and a driving circuit of a light source apparatus.

2. Description of the Related Art

In order to implement high density of an optical disc and high fineness of a display, a small-size short wavelength light source is needed. As the small-size short wavelength light source, a coherent light source has attracted attention (Yamamoto et al., Optics Letters Vol. 16, No. 15, 1156 (1991)), which combines a semiconductor laser with a light waveguide type of second harmonic generation (referred to as "SHG" hereinafter) device coupled by a quasi-phase matching (referred to as "QPM" hereinafter) method (light waveguide type of QPM-SHG device).

FIG. 1 is a schematic constitutional view of a SHG blue light source using the light waveguide type of QPM-SHG device. As shown in FIG. 1, as a semiconductor laser, a wavelength tunable DBR semiconductor laser 54 having a distributed Bragg reflector (referred to as "DBR" hereinafter) region is used. The wavelength tunable DBR semiconductor laser 54 is a 100 mW category AlGaAs group wavelength tunable DBR semiconductor laser having 0.85 μm band, and comprises an active layer region 56, a phase adjustment region 57 and a DBR region 58. An oscillation wavelength can be continuously varied by controlling a current input to the phase adjustment region 57 and the DBR region 58 at a constant ratio.

A light waveguide type of QPM-SHG device 55 which is a second harmonic generation device consists of a light waveguide 60 and a cyclic polarization reversal region 61 formed on an X plate of MgO doped $LiNbO_3$ substrate 59. The light waveguide 60 is formed by proton exchange in pyrophoric acid. The cyclic polarization reversal region 61 is formed by forming a comb-shaped electrode on the X plate of MgO doped $LiNbO_3$ substrate 59 and applying an electric field thereto.

According to the SHG blue light source shown in FIG. 1, laser of 75 mW is input to the light waveguide 60 from a laser output of 100 mW. An oscillation wavelength is fixed within a phase matching wavelength tolerance width of the light waveguide type of QPM-SHG device 55, by controlling a current amount input to the phase adjustment region 57 and the DBR region 58 in the wavelength tunable DBR semiconductor laser 54. In this SHB blue light source, blue light of about 24 mW having a wavelength of 425 nm is provided. The provided blue light has diffraction-limited converging characteristics in which a transverse mode is TEoo mode, and noise characteristics in which a relative noise intensity is small, that is, not more than −140 dB/Hz, that is, this has the characteristics suitable for reproducing the optical disc.

Meanwhile, according to the light waveguide type of QPM-SHG device 55 serving as the second harmonic generation device, in view of the blue light output characteristics to the wavelength of a fundamental wave light, a wavelength width in which its blue light output becomes half, that is, a wavelength tolerance width to the phase matching is as small as 0.1 mm. This is a big problem for getting a stable blue light output. In order to solve this problem, conventionally, a wavelength (oscillation wavelength) of the fundamental wave light emitted from the wavelength tunable DBR semiconductor laser 54 is fixed within the tolerance width of the phase matching wavelength of the light waveguide type of QPM-SHG device 55 so as to implement the stable blue light output.

In general, the oscillation wavelength of the semiconductor laser is varied by ambient temperature, and an optimal wavelength of the light waveguide type of QPM-SHG device 55 is also varied by the ambient temperature. Therefore, conventionally, the blue light output is stabilized by keeping the temperature of the semiconductor laser 54 and the light waveguide type of QPM-SHG device 55 constant using a Peltier device and the like.

However, when it is mounted on an optical information processing apparatus such as an optical disc or a laser printer, an average output power is continuously varied in an activated state. At this time, an amount of heat generated by the semiconductor laser is varied. Therefore, even when the ambient temperature is kept constant by the Peltier device and the like, the temperature of the semiconductor laser itself is varied so that the oscillation wavelength is varied. As a result, the stable blue light output cannot be provided.

In addition, when the temperature controller such as the Peltier device cannot be used because of the miniaturization of the apparatus, the ambient temperature is further largely varied, which causes an output variation of the light waveguide type of QPM-SHG device 55.

Furthermore, in the optical disc device, for example, a temperature of the active layer region 56 is varied by a current variation input to the active layer region 56 at the time of high-speed modulation and an effective optical distance L of the wavelength tunable DBR semiconductor laser 54 is varied. In order to solve the problem, in the prior art, as shown in FIG. 2A, the heat amount of the whole of the wavelength tunable DBR semiconductor laser 54 is kept almost constant by applying a current which is complementary to the current (driving current) input to the active layer region 56 as shown in FIG. 2A, to the phase adjustment region 57 as shown in FIG. 2B (hereinafter, this driving method is called a "complementary compensation method"). At this time, since the optical distance in the active layer region 56 and the optical distance in the phase adjustment region 57 are varied almost symmetrically, the effective optical distance L of the wavelength tunable DBR semiconductor laser 54 can be kept constant. Therefore, the oscillation wavelength of the wavelength tunable DBR semiconductor laser 54 can be controlled and the variation of the blue light output power can be prevented (Japanese Laid-open Patent Publication No. 2001-326418).

However, there is a problem in the above complementary compensation method. When the current is input to the phase adjustment region 57, an electric charge density in the phase adjustment region 57 is varied in response to the current, whereby a phenomenon in which a refractive index in the phase adjustment region 57 is varied (this phenomenon is called a "plasma effect"). Therefore, when the current complementary to the current (driving current) input to the active layer region 56 is applied to the phase adjustment region 57 in order to keep the heat amount in the whole of the wavelength tunable DBR semiconductor laser 54 almost constant, the effective optical distance of the semiconductor laser is varied because of the plasma effect and the blue light output power is varied.

SUMMARY OF THE INVENTION

It is an object of the present invention to provide a driving method of a semiconductor laser in which a stable harmonic output can be implemented even at the time of high-speed modulation. Furthermore, it is another object of the present invention to provide a driving method and a driving circuit of a light source apparatus comprising a second harmonic generation device which generates a second harmonic from light emitted from a semiconductor laser, in which a stable harmonic output can be also implemented.

According to the present invention, there is provided a driving method of a semiconductor laser having an active layer region, a phase adjustment region and a distributed Bragg reflector region. The method includes the steps of: calculating an average value of multipulse modulation currents modulated between a peak current and a bottom current input to the active layer region; calculating a difference between the average value of the multipulse modulation currents and a bias current input to the active layer region; applying a first compensation current to the phase adjustment region when the bias current is input to the active layer region, and applying a second compensation current corresponding to the difference to the phase adjustment region when the multipulse modulation current is input to the active layer region.

In addition, the second compensation current may be calculated by adding a current corresponding to the difference to the first compensation current.

Still further, a difference between a heat value when the multipulse modulation current is input and a heat value when the bias current is input, to the active layer region may be calculated from the difference and the second compensation current may be calculated by adding a current corresponding to the difference of the heat value to the first compensation current.

Furthermore, according to the present invention, there is provided a driving method of a light source apparatus provided with a semiconductor laser having an active layer region, a phase adjustment region and a distributed Bragg reflector region, and a second harmonic generation device for generating second harmonic from input light which is emitted from the semiconductor laser. The driving method includes the steps of: calculating an average value of multipulse modulation currents modulated between a peak current and a bottom current input to the active layer region; calculating a difference between the average value of the multipulse modulation currents and a bias current input to the active layer region; applying a first compensation current to the phase adjustment region when the bias current is input to the active layer region, and applying a second compensation current corresponding to the difference to the phase adjustment region when the multipulse modulation current is input to the active layer region.

In addition, the second compensation current may be calculated by adding a current corresponding to the difference to the first compensation current.

Furthermore, a difference between a heat value when the multipulse modulation current is input to the active layer region and a heat value when the bias current is input thereto may be calculated from the difference, and the second compensation current may be calculated by adding a current corresponding to the difference of the heat value to the first compensation current.

Still further, according to the present invention, a driving apparatus of a semiconductor laser having an active layer region, a phase adjustment region and a distributed Bragg reflector region includes an active layer driving means, a phase adjustment region driving means, and an operation unit. The active layer driving means applies a constant bias current and applies a multipulse modulation current modulated between a peak current and a bottom current, to the active layer region. The phase adjustment region driving means applies a first compensation current to the phase adjustment region when the bias current is applied to the active layer region, and applies a second compensation current to the phase adjustment region when the multipulse modulation current is applied to the active layer region. The operation unit calculates an average value of the multipulse modulation currents input to the active layer region, calculates a difference between the bias current and the average value of the multipulse modulation currents, input to the active layer region and calculates the first and second compensation currents input to the phase adjustment region by the phase adjustment region driving means, based on the difference.

Still further, according to the present invention, a semiconductor laser apparatus includes a semiconductor laser, an active layer driving means, a phase adjustment region driving means, and an operation unit. The semiconductor laser has an active layer region, a phase adjustment region and a distributed Bragg reflector region. The active layer driving means applies a constant bias current and applies a multipulse modulation current modulated between a peak current and a bottom current, to the active layer region. The phase adjustment region driving means applies a first compensation current to the phase adjustment region when the bias current is input to the active layer region, and applies a second compensation current to the phase adjustment region when the multipulse modulation current is input to the active layer region. The operation unit calculates an average value of the multipulse modulation currents input to the active layer region, calculates a difference between the bias current and the average value of the multipulse modulation currents, input to the active layer region, and calculates the first and second compensation currents applied to the phase adjustment region by the phase adjustment region driving means, based on the difference.

Still further, according to the present invention, a light source apparatus includes a semiconductor laser, an active layer driving means, a phase adjustment region driving means, and an operation unit. The semiconductor laser has an active layer region, a phase adjustment region and a distributed Bragg reflector region, a second harmonic generation device for generating second harmonic from input light which is output from the semiconductor laser. The active layer driving means applies a constant bias current and applies a multipulse modulation current modulated between a peak current and a bottom current, to the active layer region. The phase adjustment region driving means applies a first compensation current to the phase adjustment region when the bias current is applied to the active layer region, and applies a second compensation current to the phase adjustment region when the multipulse modulation current is applied to the active layer region. The operation unit calculates an average value of the multipulse modulation currents input to the active layer region, calculates a difference between the bias current and the average value of the multipulse modulation currents, input to the active layer region, and calculates the first and second compensation currents input to the phase adjustment region by the phase adjustment region driving means, based on the difference.

In addition, the second harmonic generation device may be quasi-phase matched with the semiconductor laser.

According to the driving method of the semiconductor laser of present invention, the average value of the multipulse modulation currents input to the active layer region is calculated, a difference between it and the bias current is calculated, and when the multipulse modulation current is applied to the active layer region, the second compensation current corresponding to the difference is input to the phase adjustment region. Thus, the heat generated in the active layer region and the heat generated in the phase adjustment region can be offset, and the wavelength variation caused by the plasma effect can be prevented to the minimum, whereby the desired blue light power (second harmonic output) can be provided.

BRIEF DESCRIPTION OF THE DRAWINGS

The present invention will become readily understood from the following description of preferred embodiments thereof made with reference to the accompanying drawings, in which like parts are designated by like reference numeral and in which:

FIG. 11A is a view of setting of a driving current to an active layer region, FIG. 11B is a view of setting of a compensation current to a phase adjustment region, FIG. 11C is a view of a blue light power of a second harmonic, FIG. 11D is a view of a relation between the driving current to the active layer region and the compensation current to the phase adjustment region, and FIG. 11E is a view of a relation between the driving current to the active layer region and the blue light power;

FIG. 13 is a view of the compensation current input to the phase adjustment region, in a case where a difference $I_{opDIFF}$ between an average value $I_{opAVE}$ of a multipulse modulation circuits and a bias current IE when a recording space is formed is positive;

FIG. 14 is a view of set values of current sources constituting the compensation current input to the phase adjustment region shown in FIG. 13;

FIG. 15 is a view of the compensation current input to the phase adjustment region, in a case where a difference $I_{opDIFF}$ between an average value $I_{opAVE}$ of multipulse modulation currents and a bias current IE when the recording space is formed is negative;

FIG. 16 is a view of set values of current sources constituting the compensation current input to the phase adjustment region shown in FIG. 15;

FIG. 17A is a view of variation of input current to active layer region;

FIG. 17B is a view of variation of input current to phase adjustment region;

FIG. 17C is a block diagram of a wavelength variation analysis model;

FIGS. 18A to 18F are views of behaviors of parts of the wavelength variation analysis model shown in FIG. 17; and FIGS. 19A to 19D are views of an output variation of the second harmonic when light containing the wavelength variation shown in FIGS. 18A to 18F is input to a light waveguide type of QPM-SHG device.

DETAILED DESCRIPTION OF THE PREFERRED EMBODIMENTS

Figure 1:
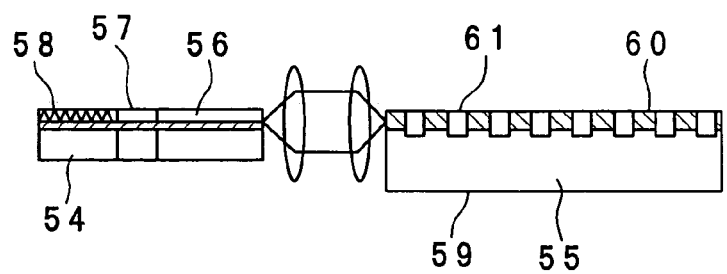
FIG. 1 is a schematic constitutional view of a SHG blue light source using a conventional light waveguide type of QPM-SHG device.
Figure 2A:
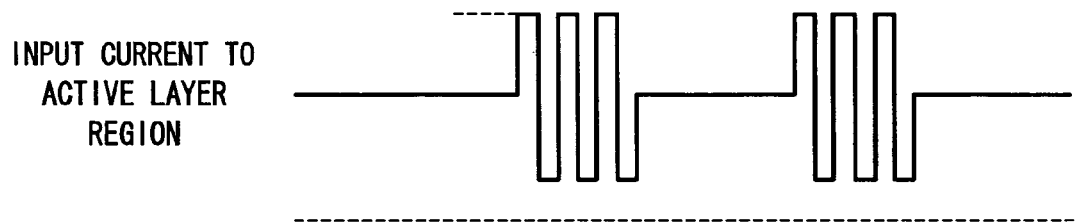
FIG. 2A is view of an input current to an active layer region in a conventional laser driving method.
Figure 2B:
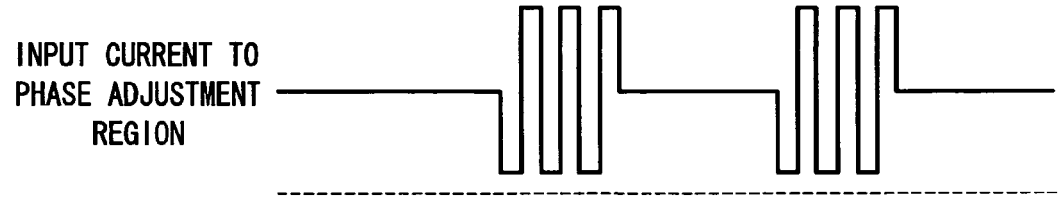
FIG. 2B is view of an input current to a phase adjustment region in a conventional laser driving method.

Hereinafter, a description is made of a driving method and a driving circuit of a light source apparatus according to an embodiment of the present invention with reference to the accompanying drawings. In addition, the substantially same components are allotted to the same reference numerals.

Embodiments

Figure 3:
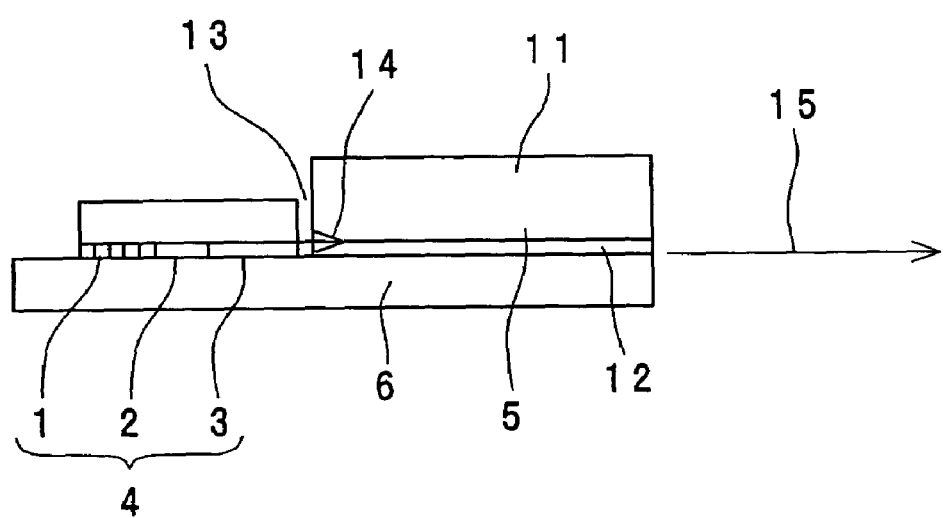
FIG. 3 is a schematic constitutional view of a SHG blue light source using a light waveguide type of QPM-SHG device according to an embodiment of the present invention.

FIG. 3 is a schematic constitutional view of a light source apparatus according to an embodiment of the present invention. The light source apparatus comprises a semiconductor laser 4 for emitting fundamental wave light, and a second harmonic generation device 5 for generating second harmonic from the input light which was emitted from the semiconductor laser. As this semiconductor laser 4, a 100 mW category AlGaAs group of wavelength tunable distributed Bragg reflector (referred to as a DBR hereinafter) semiconductor laser 4 having 0.85 μm band is used, which has a DBR region 1, a phase adjustment region 2 for adjusting a phase of light in laser by a current input thereto, and an active layer region 3 for controlling its output power by a driving current, for example.

In addition, as the second harmonic generation device 5, a light waveguide type of second harmonic generation (referred to as "SHG" hereinafter) device 5 which is coupled with the semiconductor laser 4 by a quasi-phase matching (referred to as "QPM" hereinafter) method, that is, a light waveguide type of QPM-SHG device 5 is used. The light waveguide type of QPM-SHG device 5 consists of light waveguide 12 and a cyclic polarization reversal region intersecting with the light waveguide 12 at right angles, for compensating a propagation constant difference between the fundamental wave and the harmonic which are formed on an upper surface of an optical crystal substrate (X plate of MgO doped LiNbO$_3$ substrate having a thickness of 0.5 mm) using lithium niobate (LiNbO$_3$). The light waveguide 12 is formed by proton exchange in pyrophoric acid. The cyclic polarization reversal region is formed by forming a comb-shaped electrode on the X plate of MgO doped LiNbO$_3$ substrate 11 and applying an electric field thereto. Since the light waveguide type of QPM-SHG device 5 can use a large nonlinear optical constant and has a long interaction length because of the light waveguide type, a high conversion efficiency can be implemented.

The semiconductor laser 4 and the light waveguide type of QPM-SHG device 5 are integrally formed on a Si sub-mount 6 and their temperature is controlled by a Peltier device. The semiconductor laser beams of the fundamental wave light is connected to the light waveguide of the light waveguide type of QPM-SHG device 5 by direct connection without using a lens. That is, the fundamental wave light emitted from the semiconductor laser 4 is input to the light waveguide type of QPM-SHG device 5, and the fundamental wave light input to the light waveguide type of QPM-SHG device 5 propagates in the light waveguide 12. The fundamental wave light propagating in the light waveguide 12 is converted to the second harmonic by nonlinear property of the optical crystal (X plate of MgO doped $LiNbO_3$) and harmonic light having a wavelength which is a half of that of the fundamental wave light is emitted from the emission end face of the light waveguide type of QPM-SHG device 5.

Figure 4:
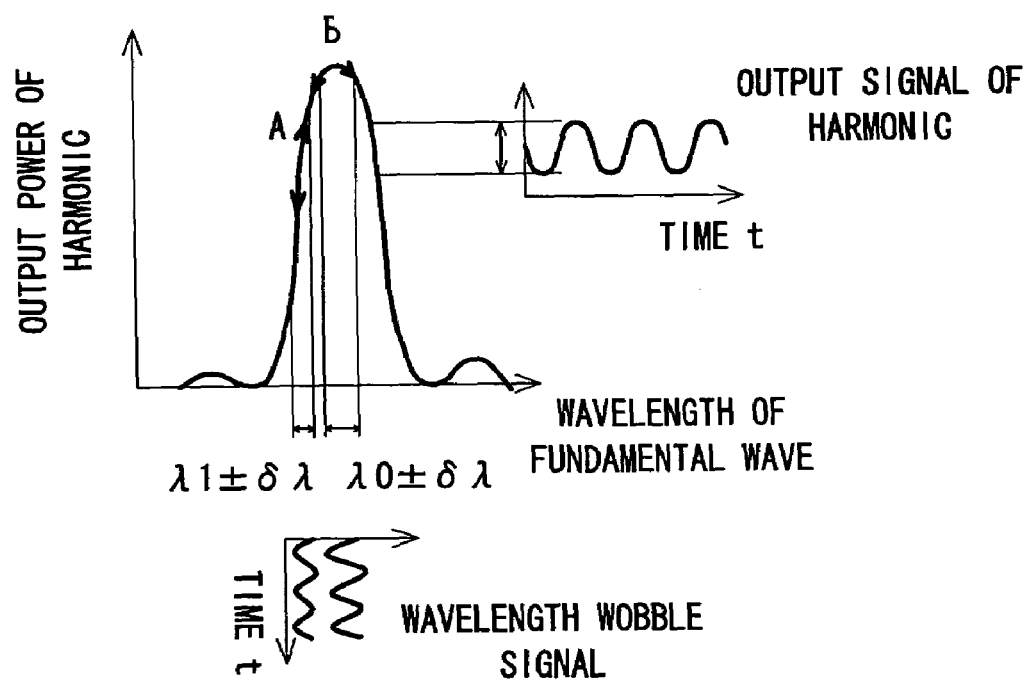
FIG. 4 is a view of an output power of harmonic light emitted to a wavelength of a fundamental wave light in the light waveguide type of QPM-SHG device.

The light waveguide type of QPM-SHG device (referred to as also "SHG device" hereinafter) having the above-described structure has wavelength characteristics shown in FIG. 4 to the wavelength of the input fundamental wave light because of wavelength dispersion characteristics of the optical crystal (X plate of MgO doped $LiNbO_3$). FIG. 4 shows a relation between the wavelength of the input fundamental wave light and an output power of the emitted harmonic light. The harmonic light shows output characteristics expressed by a SINC function shown in the following equation (1) in which $\lambda_0$ is a peak of an optimal wavelength of the fundamental wave light and $\lambda$ is a wavelength of the fundamental wave light.

$$Y = \mathrm{sinc}\{(\lambda - \lambda_0)*\pi/a\} \quad (1)$$
$$= \sin\{(\lambda - \lambda_0)*\pi/a\}/\{(\lambda - \lambda_0)*\pi/a\}$$

Here, wavelength tolerance expressed by a wavelength width in which the harmonic output power becomes a half of a maximum value is approximately 0.1 nm and in order to stably obtain a blue light output, it is necessary to control the wavelength of the fundamental wave light to $\lambda_0$ accurately and stably.

Hereinafter, a description is made of a method of controlling an oscillation wavelength of the semiconductor laser 4 shown in FIG. 3.

In the semiconductor laser, only the light having the wavelength of $\lambda$ which satisfies the following equation (2) is excited in an optical distance L on forward and backward reflection surfaces.

$$2L = n*\lambda (n: \text{integer number}) \quad (2)$$

The line of the wavelength $\lambda$ satisfying the above equation (2) is called "longitudinal mode" and the oscillation wavelength in this case takes the discrete value. In the semiconductor laser 4 shown in FIG. 3, there is provided the phase adjustment region 2 between the DBR region 1 and the emission end face of the semiconductor laser 4, and the optical distance L of the semiconductor laser 4 is varied depending on the input current to the phase adjustment region 2, so that the wavelength $\lambda$ of the longitudinal mode can be varied. Thus, the oscillation wavelength of the semiconductor laser 4 can be controlled by the input current to the phase adjustment region 2.

However, according to this wavelength controlling method, a wavelength control range is limited because of the following reason. That is, a grating is formed in the DBR region 1 of the semiconductor laser 4 shown in FIG. 3 and only the light of the wavelength defined by its cycle is reflected. More specifically, when it is assumed that a refractive index of the DBR region 1 is $n_{dbr}$, and a grating cycle of the DBR region 1 is $\Lambda$, the range of the wavelength of the light which can be reflected in the DBR region 1 is approximately, $2\Lambda/n_{dbr} \pm 0.1$ nm and the wavelength can be controlled only in this range.

According to this embodiment, in order to enlarge the wavelength control range, the following method is employed. That is, an electrode has been formed in the DBR region 1 and an effective grating cycle of the DBR region 1 is varied and the optimal wavelength in the DBR region 1 is varied by the current input to the electrode. The oscillation wavelength can be continuously controlled by varying the optimal wavelength of the DBR region 1 so as to follow the variation of the wavelength in the longitudinal mode generated by the current input to the phase adjustment region 2. Actually, the current of a constant ratio is input to the DBR region 1 and the phase adjustment region 2.

In addition, in order to solve the problem such that the stable blue light output cannot be provided because the temperature of the semiconductor laser itself is varied and accordingly the oscillation wavelength is varied, the above-described complementary compensation method can be used. However, in this method, an electric charge density in the phase adjustment region 57 is varied depending on the current input to the phase adjustment region 57, whereby a plasma effect in which the refractive index in the phase adjustment region 57 is varied is generated. Because of the plasma effect, the effective optical distance L of the semiconductor laser is varied and the blue light output power is varied.

Figure 5:
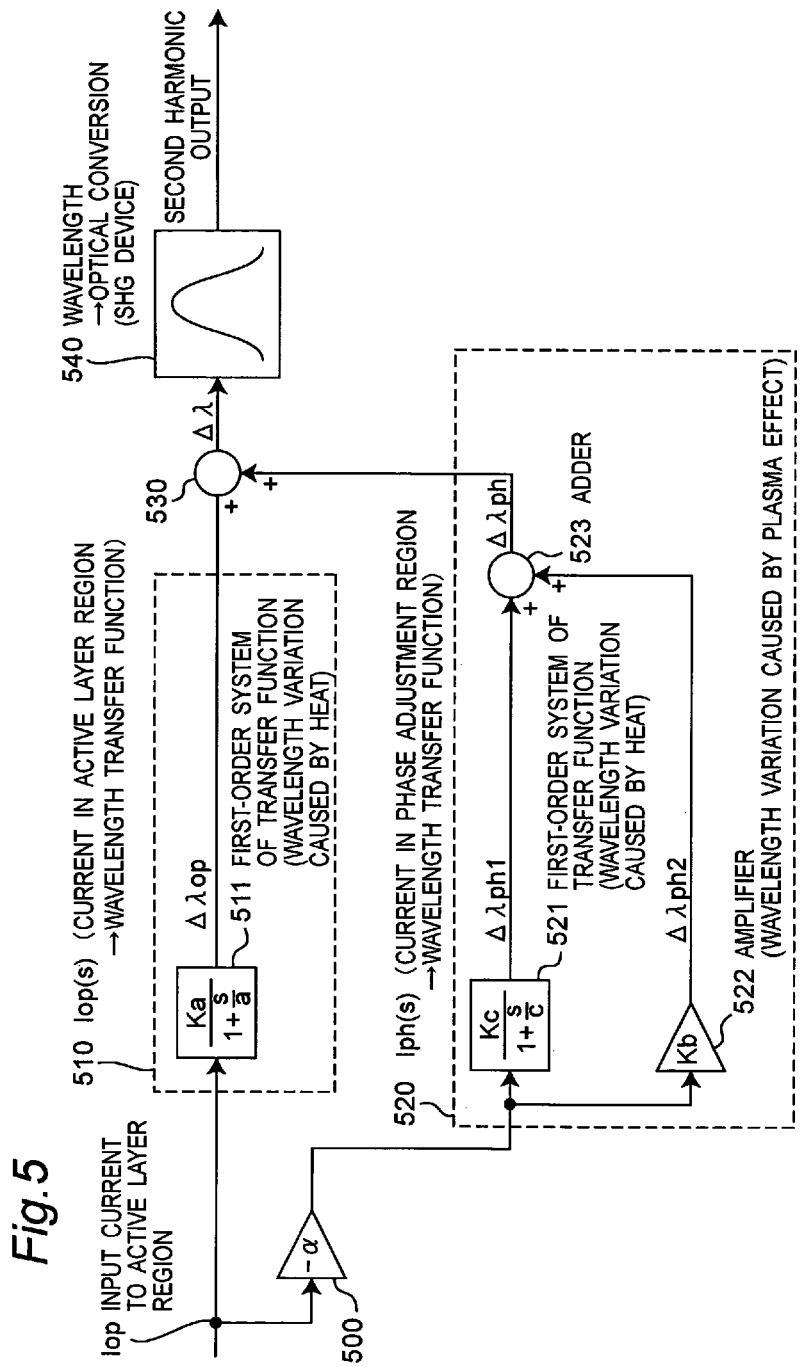
FIG. 5 is a block diagram of a wavelength variation analysis model.

The inventors of the present invention analyzed a behavior of the second harmonic output variation because of the wavelength variation caused by the current input to the active layer region and the current input to the phase adjustment region, using a simple model (hereinafter, this model is referred to as a "wavelength variation analysis model") shown in FIG. 5.

When the current is input to the active layer region 3, the active layer region 3 is heated by the current (Iop). Thus, its refractive index is varied, the optical distance L is varied and the wavelength of the semiconductor laser is varied. Since a transfer function 510 of the wavelength variation caused by the current Iop is a response from the heat, it is expressed as a first-order system of transfer function 511 and when $\Delta\lambda$op is the wavelength variation caused by the current Iop, the following equation is provided.

$$\Delta\lambda op = Ka/(1+(s/a))$$

In addition, when the current Iop is input into the active layer region 3, a current of reversed phase from the driving current Iop is input into the phase adjustment region 2 in the complementary compensation method. According to the model in FIG. 5, the driving current Iop is multiplied by $-\alpha$ by a reverse amplifier 500 to generate a current Iph to be input into the phase region.

A transfer function 520 shows a wavelength variation caused by the current Iph input to the phase adjustment region. A transfer function 521 shows a component which varies the wavelength of the semiconductor laser because the optical distance L is varied by the heat generated by the current Iph. Since the transfer function 521 is a response from the heat, it is expressed as a first-order system of transfer function 511 and when $\Delta\lambda ph1$ is the wavelength variation caused by the current Iph, the following equation is provided.

$$\Delta\lambda ph1 = Kc/(1+(s/c))$$

A transfer function 522 shows a component which varies the wavelength by the current Iph. More specifically, an electric charge density in the phase adjustment region 2 is varied by the current Iph and a refractive index in the phase adjustment region 2 is varied in proportion to the variation of the electric charge density (plasma effect). The optical distance L is varied because the refractive index in the phase adjustment region 2 is varied and the wavelength of the semiconductor laser 4 is varied. Since the wavelength tunable component by the current Iph is proportional to the current, it is expressed as a transfer function of the amplifier 522. When $\Delta\lambda ph2$ is a wavelength variation by the plasma effect of the current Iph, it is expressed by the following equation.

$$\Delta\lambda ph2 = Kb$$

Therefore, when $\Delta\lambda ph$ is a wavelength variation by the current Iph, it is expressed as follows.

$$\Delta\lambda ph = \Delta\lambda ph1 + \Delta\lambda ph2$$

The wavelength variation $\Delta\lambda$ of the semiconductor laser 4 is provided by adding the wavelength variation $\Delta\lambda ph$ by the current Iop to the wavelength variation $\Delta\lambda ph$ by the current Iph by an adder 530 as follows.

$$\Delta\lambda = \Delta\lambda op + \Delta\lambda ph$$

The light having the wavelength variation $\Delta\lambda$ is input to the light waveguide type of QPM-SHG device 5. Since the light waveguide type of QPM-SHG device 5 has very sharp band-pass characteristics to the wavelength, a transfer function 540 of the second harmonic output to the input wavelength of the light waveguide type of QPM-SHG device 5 is expressed as follows.

$$G(\Delta\lambda) = \exp(\Delta\lambda/(\lambda 1/e))$$

Using the above model, the behavior of the second harmonic output variation was understood, which was caused by the wavelength variation because of the driving current Iop input to the active layer region 3 and the current Iph input to the phase adjustment region 2.

Figure 6A:
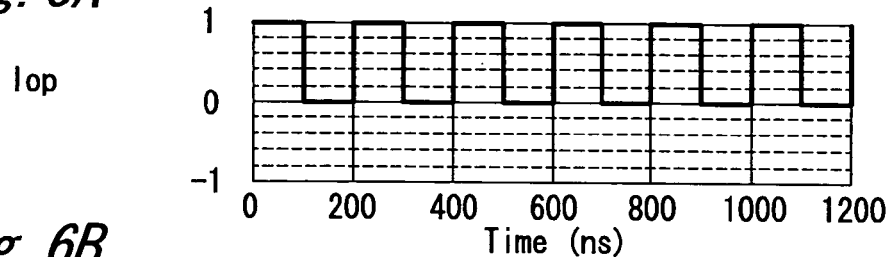
FIGS. 6A to 6F are views each showing a behavior of each part of the wavelength variation analysis model shown in FIG. 5.
Figure 6B:
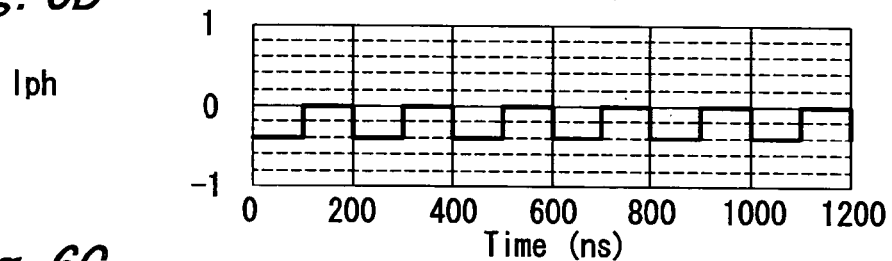
Figure 6C:
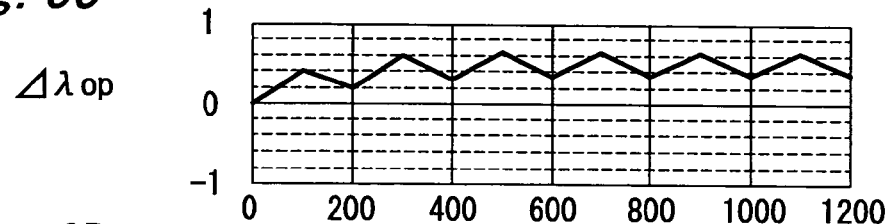
Figure 6D:
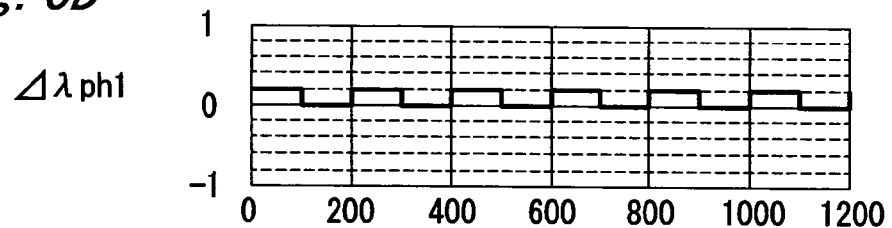
Figure 6E:
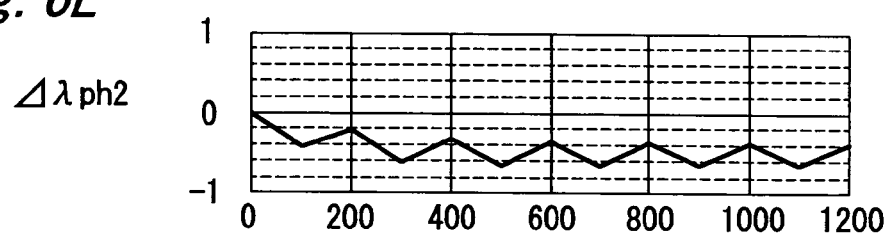
Figure 6F:
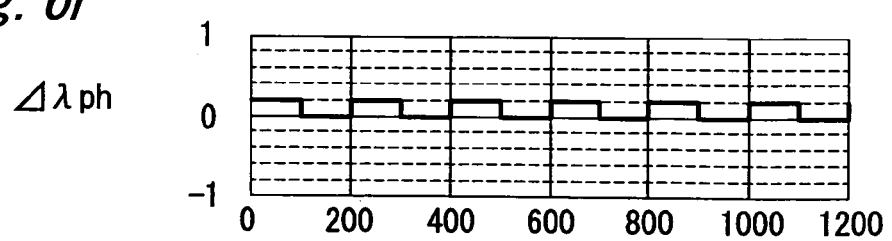

Here, a description is made of a behavior of each part in the above model in a case where a simple rectangular wave current is input into the active layer region 2 with reference to FIGS. 6A to 6F. FIG. 6A shows the driving current Iop input to the active layer region 2, which is the simple rectangular wave current. FIG. 6B shows the current Iph input to the phase adjustment region 2, which is obtained by multiplying the current Iop by $\Delta\lambda$ in the reverse amplifier 500. FIG. 6C shows the wavelength variation $\Delta\lambda op$ caused by the heat generated by the driving current Iop. FIG. 6D shows the wavelength variation $\Delta\lambda ph1$ caused by the heat generated by the current Iph. FIG. 6E shows the wavelength variation $\Delta\lambda ph2$ caused by the plasma effect provided by the current Iph. FIG. 6F shows a total wavelength variation caused by the current Iop and the current Iph. As is clear from the above drawings, in the complementary compensation method in the prior art, when the complementary current Iph is input to the phase adjustment region 2 so as to offset the heat amount generated by the driving current Iop, the light output having the wavelength variation caused by the plasma effect is input to a light waveguide type of QPM-SHG device 304 as it is.

Figure 7:
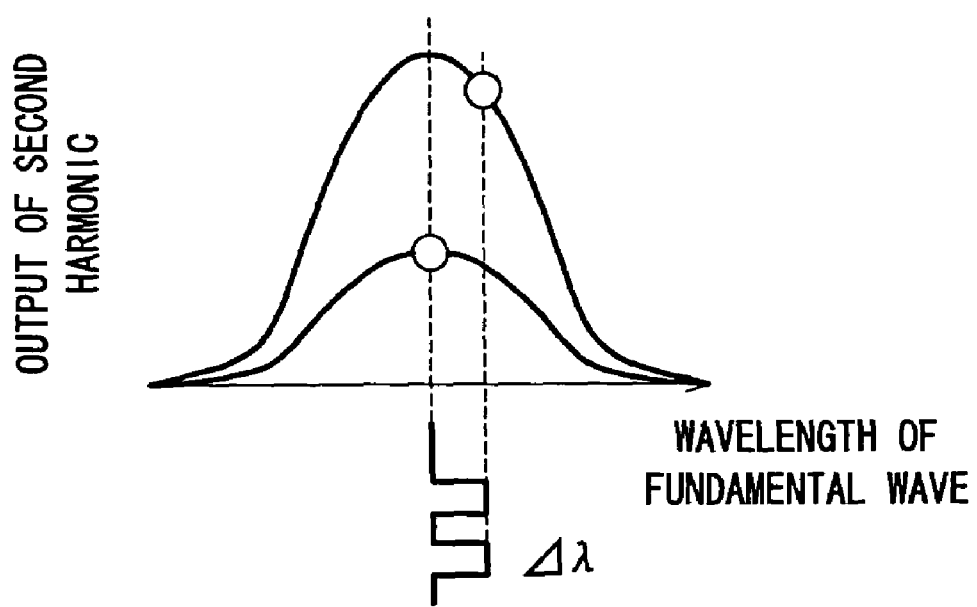
FIG. 7 is a view of an output variation of a second harmonic when light input to the light waveguide type of QPM-SHG device contains wavelength variation.

Therefore, as shown in FIG. 7, the wavelength is varied and shifted from the maximum efficiency wavelength of the light waveguide type of QPM-SHG device 5, so that the second harmonic output is varied and the maximum output of the second harmonic cannot be provided.

Figure 8A:
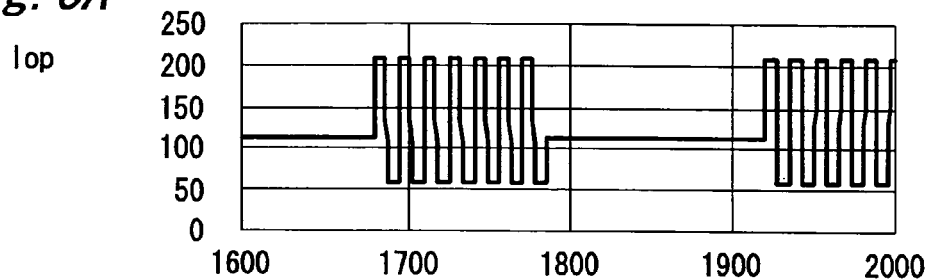
FIGS. 8A to 8E are views each showing a behavior of each part of the wavelength variation analysis model.
Figure 8B:
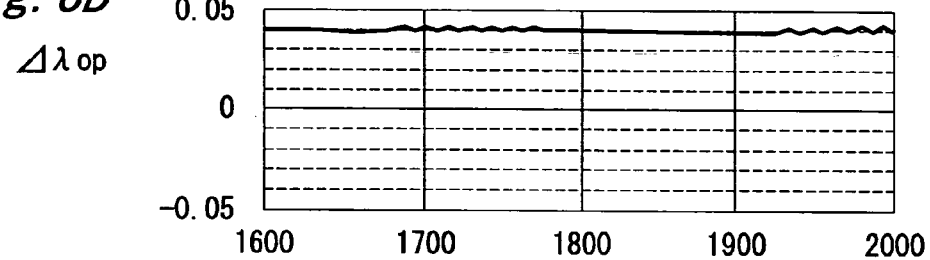
Figure 8C:
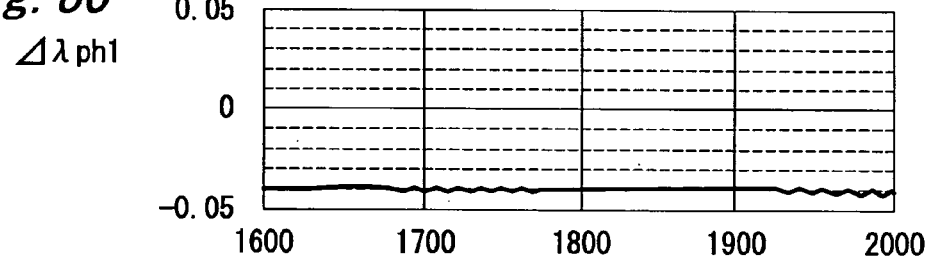
Figure 8D:
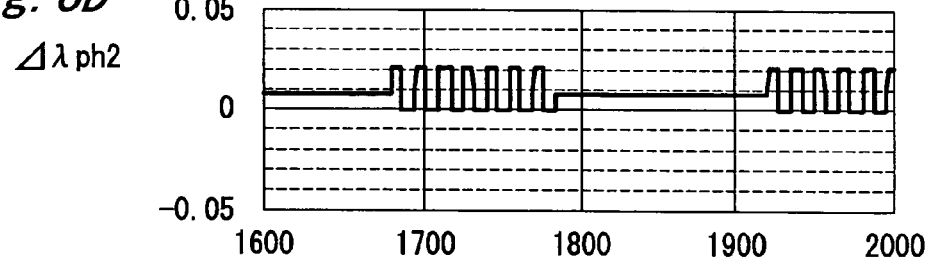
Figure 8E:
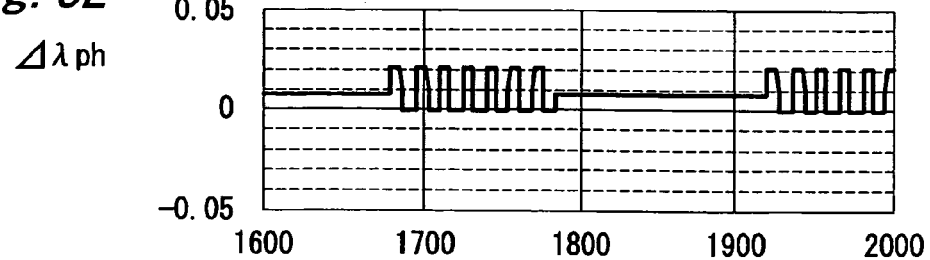

Here, using the above model and the input current waveform used actually in recording on the optical disc, the behavior of the wavelength variation is examined. FIGS. 8A to 8E show a behavior of each part. FIG. 8A shows the input current Iop input to the active layer region 3. Here, the current when a recording mark and recording space are formed actually is input. It is noted that the input current Iph (not shown) to the phase adjustment region 2 is obtained by multiplying the current Iop by $\Delta\lambda$ in the reverse amplifier 500. FIG. 8B shows the wavelength variation $\Delta\lambda op$ caused by the heat generated by the driving current Iop. FIG. 8C shows the wavelength variation $\Delta\lambda ph1$ caused by the heat generated by the current Iph. FIG. 8D shows the wavelength variation $\Delta\lambda ph2$ caused by the plasma effect provided by the current Iph. FIG. 8E shows a total wavelength variation caused by the driving current Iop and the current Iph. As is clear from the above drawings, although the wavelength variation $\Delta\lambda op$ caused by the heat generated by the driving current Iop and the wavelength variation $\Delta\lambda ph1$ caused by the heat generated by the Iph are offset, the wavelength variation caused by the plasma effect is remained as it is and the light output having that wavelength variation is input to the light waveguide type of QPM-SHG device as it is.

Figure 9A:
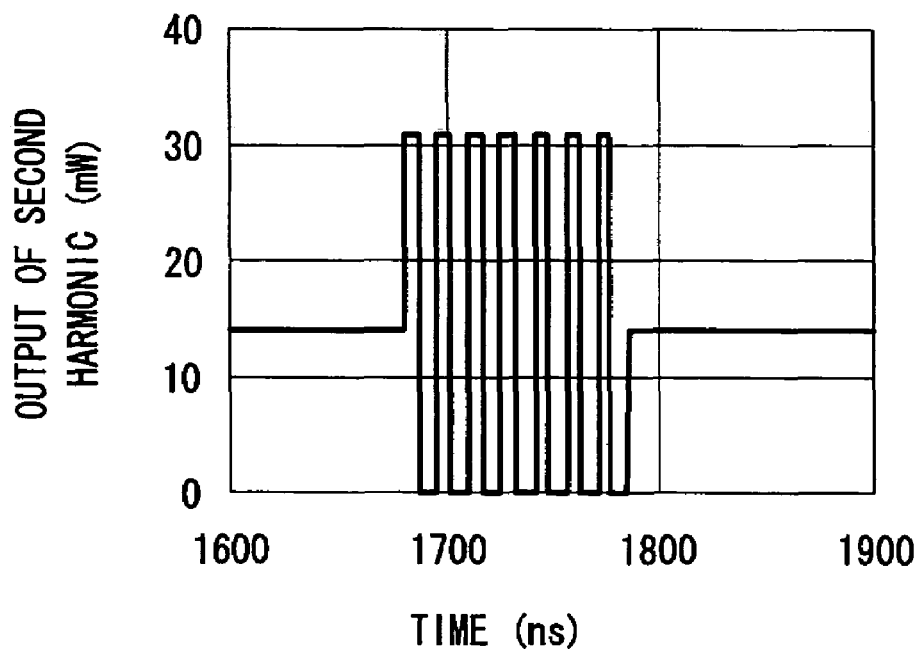
FIG. 9A is view of an output variation of a second harmonic as multipulse.
Figure 9B:
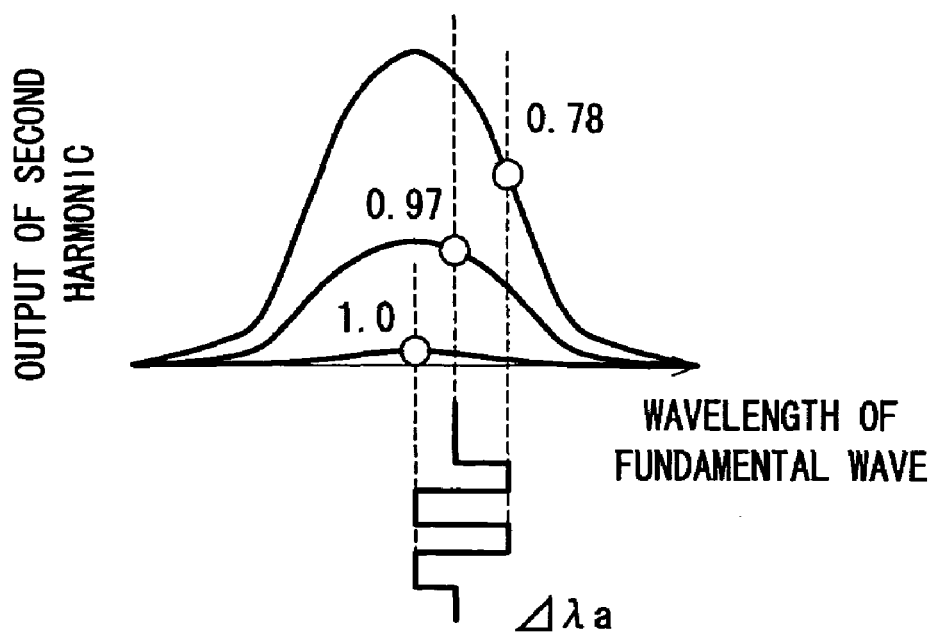
FIG. 9B is view of an output variation of a second harmonic when light input to the light waveguide type of QPM-SHG device contains wavelength variation.

Therefore, as shown in FIG. 9B, the wavelength is varied and shifted from the maximum efficiency wavelength of the light waveguide type of QPM-SHG device. As a result, the second harmonic output is varied and the peak value of the second harmonic output becomes 0.78 time. Consequently, a desired maximum output of the second harmonic cannot be obtained.

Thus, the inventors of the present invention devised a new method called "pulse average compensation method" against the complementary compensation method in the prior art. In this method, a difference between an average current of multipulse modulation currents when the recording mark is formed and a bias current when the recording space is formed is calculated and the compensation current Iph input to the phase adjustment region 302 is controlled according to the difference. More specifically, a first constant compensation current is applied to the phase adjustment region 302 when the recording space is formed, and a constant second compensation current provided by adding the current corresponding to the above difference to the first compensation current is applied when the recording mark is formed. Thus, the multipulse modulation current is not applied to the phase adjustment region 302 but only the minimum necessary compensation current Iph for compensating the heat generated between the active layer region and the phase adjustment region is applied thereto. Thus, the heat generated between the active layer region 301 and the phase adjustment region 302 is compensated to offset the wavelength variation caused by the heat, and the wavelength variation caused by the plasma effect can be controlled.

Hereinafter, the method is described in detail.

Figure 10:
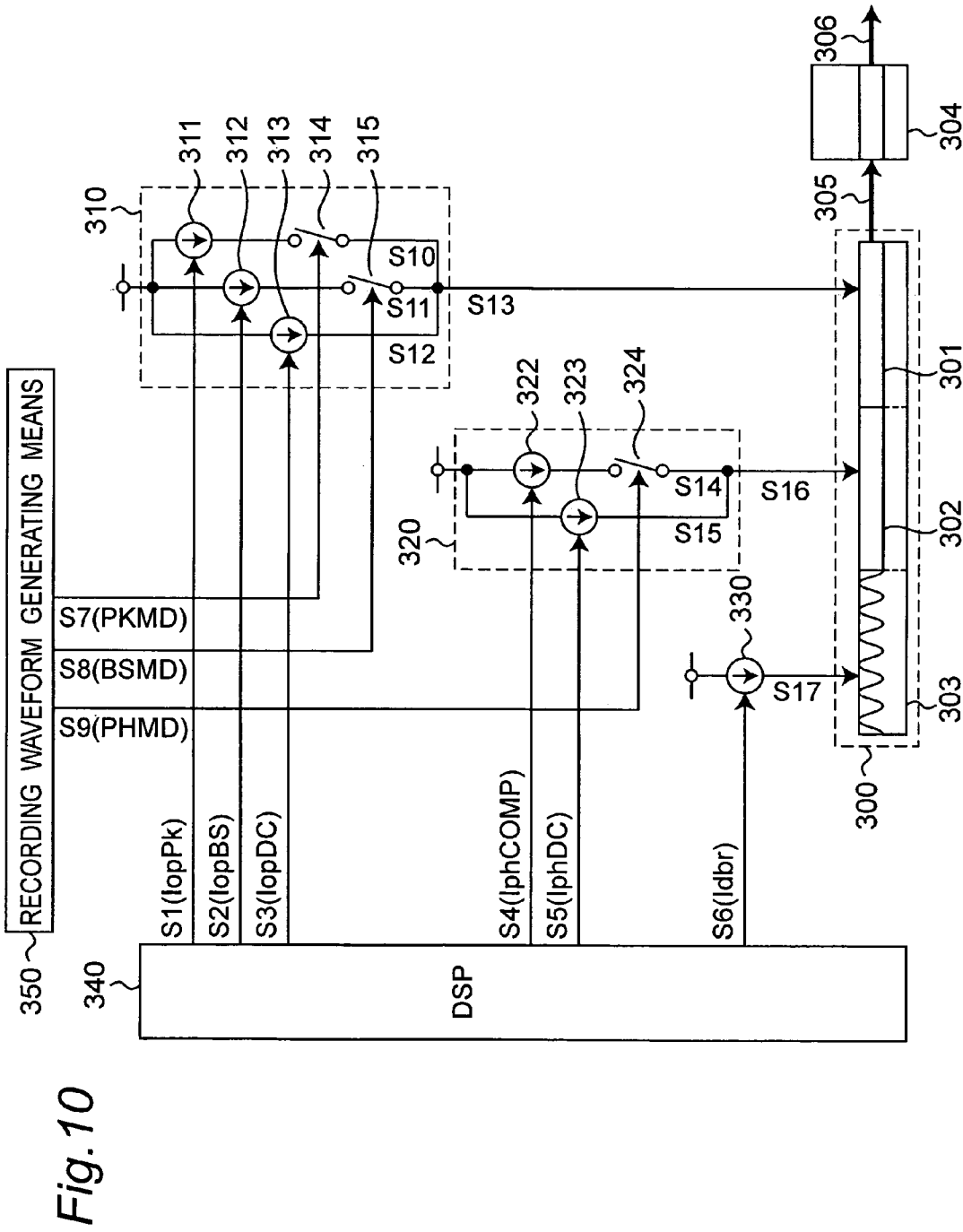
FIG. 10 is a view of a constitution of a driving device of a light source apparatus according to the embodiment of the present invention.

FIG. 10 is a block diagram of the light source driving circuit according to this embodiment of the present invention. The light source driving circuit comprises an active layer region driving circuit 310, a phase adjustment region driving circuit 320, a DBR region driving circuit 330, an operation unit 340, and recording wave generation unit 350. The active layer region driving circuit 310 comprises a peak current source 311, a bias current source 312, a DC current source 313, a switch 314 for switching the peak current source 311, and a switch 315 for switching the bias current source 312. The phase adjustment region driving circuit 320 comprises a space current source 322, a mark current source 323, and a switch 324 for switching the space current source 322. The operation unit 340 sets currents for the three current sources 311, 312 and 313 of the active layer region driving circuit 310, sets currents for the two current sources 322 and 323 of the phase adjustment region driving circuit 320, and sets a current of the DBR region driving circuit 330. The recording wave generation unit 350 outputs signals S7 and S8 to the switches 314 and 315 of the active layer region driving circuit 310 to perform switching, and outputs a signal S9 to the switch 324 of the phase adjustment region driving circuit 320 to perform switching.

Next, an operation of each part of the driving device in the light source apparatus is described. The description is made in a case the light source apparatus is used in a recording method to the optical disc, for example. In the recording on the optical disc, in order to form the preferable recording mark and recording space shown in FIG. 13, it is necessary to modulate the blue light power which is the second harmonic output as shown in FIG. 13, for example. In forming the recording mark, the multipulse modulation current between a peak current and a bottom current is applied to the active layer region 301 and multipulse light is emitted between a peak power and a bottom power. Meanwhile, in forming the recording space, the constant bias current is input to the active layer region 301 and light is emitted with a constant bias power.

In order to implement the above light modulation, the active layer region 301 of the wavelength tunable DBR semiconductor laser 300 is modulated at high speed by the active layer region driving circuit 310. The active layer region driving circuit 310 comprises the peak current source 311, the bias current source 312 and the DC current source 313 as described above. A set value $1_{opPK}$ of the peak current source 311, a set value $I_{opBS}$ of the bias current source 312 and a set value $I_{opDC}$ of the DC current source 313 are set by the operation unit (DBP) 340 so as to be able to obtain the blue light power (second harmonic output) required for forming the recording mark and the recording space.

The inventors of the present invention found that there was a relation shown by the following equation (3) between the driving current (Iop) of the active layer region 301 and the blue light power (P), as shown in FIG. 11E.

$$P=a*(Iop-Iph)^2 \quad (3)$$

Here, "a" is a constant.

In addition, the inventors of the present invention found that there was a relation shown by the following equation (4) between the driving current Iop input to the active layer region 301 and the compensation current Iph input to the phase adjustment region, which provides a wavelength in which conversion efficiency from infrared light to the blue light in the SHG device 304 becomes a maximum (hereinafter, referred to as a "maximum efficiency wavelength").

$$Iph=-\alpha*(Iop)+\beta \quad (4)$$

Here, "α" and "β" are constants.

FIGS. 11A to 11E show a relation between the driving current (Iop) of the active layer region and the blue light power (P) (FIG. 11D), and further shows a relation between the driving current Iop toward the active layer region 301 and the compensation current Iph toward the phase adjustment region, which provide the maximum efficiency wavelength from the infrared light to the blue light in the SHG element 304 (FIG. 11E). The above two characteristics found by the inventors are provided by finding a value of Iph in which the blue light power becomes the maximum and the blue light power at that time, by sweeping the compensation current Iph input to the phase adjustment region 302 while by sequentially varying the driving current Iop input to the active layer region 301 as shown in FIG. 11A to FIG. 11C at the time of start of the apparatus, for example.

Figure 12:
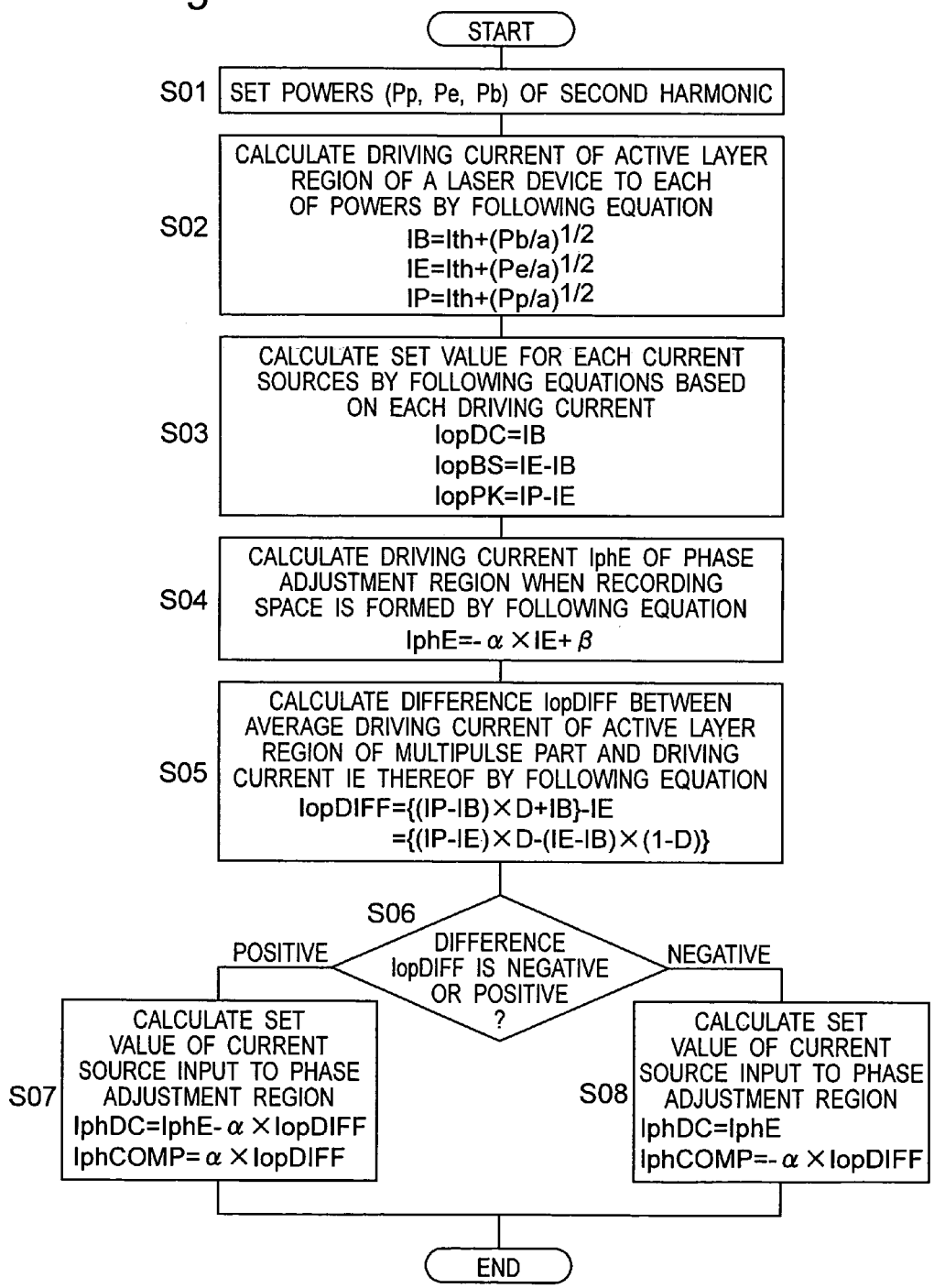
FIG. 12 is a flowchart of a method of calculating the compensation current input to the phase adjustment region according to the embodiment of the present invention.

FIG. 12 is a flowchart of a driving method of the light source apparatus. The driving method of the light source apparatus is described hereinafter.

(a) First, a peak power Pp, a bias power Pe and a bottom power Pb are set S01.

(b) Then, the driving current (hereinafter, referred to as Iop) of the active layer region 301 for each power is calculated by the operation unit (DSP)340 S02. From the characteristics between the driving current of the active layer region 301 and the blue light power (P), that is, $$P=a*(Iop-Iph)^2,$$

a bottom driving value IB, a bias driving value IE and a peak driving value IP of the Iop are calculated as follows.

$$IB=Ith+(Pb/a)^{1/2}$$

$$IE=Ith+(Pe/a)^{1/2}$$

$$IP=Ith+(Pp/a)^{1/2}$$

(c) The driving current Iop applied from the active layer region driving circuit 310 to the active layer region 301 is obtained by an additional type between the peak current source 311, the bias current source 312 and the DC current source 313. Therefore, the set value at each current source is calculated as follows (S03)

$$I_{opBM}=IB$$

$$I_{opBS}=IE-IB$$

$$I_{opPK}=IB-IP$$

The light output modulation of the wavelength tunable DBR semiconductor laser 300 can be implemented at high speed by switching the peak current source 311 and the bias current source 312 by the switches 314 and 315 corresponding to modulation signals PKMD and BSMD output from the recording wave generating means 350.

(d) In addition, the phase adjustment region 302 is driven by the phase adjustment region driving circuit 320. The phase adjustment region driving circuit 320 comprises the space current source 322 and the mark current source 323. Set values $I_{phSP}$ and $I_{phMK}$ of the space current source 312 and the mark current source 313 are respectively set by the operation unit 340 as follows.

From the relation between the currents Iop and Iph, which provide the wavelength in which the efficiency for converting the infrared light to the blue light in the SHG device 304 becomes the maximum, that it, $$Iph=-\alpha*(Iop)+\beta,$$

a compensation current IphE when the recording space is formed is calculated using the driving current IE input to the active layer region 301 as follows (S04).

$$I_{phE}=-\alpha*(IE)+\beta$$

(e) In addition, an average driving current $I_{opAVE}$ of the multipulse modulation currents in the active layer region when the recording mark is formed is expressed using a duty ratio D as follows.

$$I_{opAVE} = \{(IP-IB)*D+IB\}$$

A difference $I_{opDIFF}$ between the average driving current $I_{opAVE}$ of the multipulse modulation current and the driving current IE when the recording space is formed is expressed as follows (S05).

$$I_{opDIFF} = \{(IP-IB)*D+IB\} - IE$$
$$= \{(IP-IE)*D + (IE-IB)*(1-D)\}$$

(f) Then, it is determined whether the difference IopDIFF is negative or positive (S06). This is because the compensation amount when the recording mark is formed is adjusted to the negative or the positive to the first compensation current $I_{phE}$ applied to the phase adjustment region 302 when the recording space is formed, depending on the negative or the positive.

(g1) When the difference $I_{opDIFF}$ is positive, it means that the average value $I_{opAVE}$ of the multipulse modulation currents when the recording mark is formed is higher than the driving current IE when the recording space is formed. In this case, regarding the compensation current to the phase adjustment region 302, the second compensation current $I_{phMK}$ when the recording mark is formed must be lower than the first compensation current $I_{phSP}$ ($=I_{phE}$) when the recording space is formed, corresponding to the difference $I_{opDIFF}$. This $I_{phSP}$ and $I_{phMK}$ are calculated as follows.

$$I_{phSP} = I_{phE}$$

$$I_{phMK} = I_{phE} - \alpha * I_{opDIFF}$$

The compensation current Iph input to the phase adjustment region 302 is provided by adding the space current source 322 to the mark current source 323. Then, the set value $I_{phCOMP}$ of the space current source 322 and the set value $I_{phDC}$ of the mark current source 323 in the phase adjustment region driving circuit 320 are calculated as follows (S07).

$$I_{phDC} = I_{phE} - \alpha * I_{opDIFF}$$

$$I_{phCOMP} = \alpha * I_{opDIFF}$$

In this case, the modulation signal S9 (PHMD) is output so as to switch on the switch 324 when the recording space is formed and switch off the switch 324 when the recording mark is formed.

(g2) When the difference $I_{opDIFF}$ is negative, it means that the driving current IE when the recording space is formed is higher than the average value $I_{opAVE}$ of the multipulse modulation currents when the recording mark is formed. In this case, regarding the compensation current to the phase adjustment region 302, the second compensation current $I_{phMK}$ when the recording mark is formed must be higher than the first compensation current $I_{phSP}$ ($=I_{phE}$) when the recording space is formed, corresponding to the difference $I_{opDIFF}$. This $I_{phSP}$ and $I_{phMK}$ are calculated as follows.

$$I_{phSP} = I_{phE}$$

$$I_{phMK} = I_{phE} - \alpha * I_{opDIFF}$$

The compensation current Iph input to the phase adjustment region 302 is provided by adding the space current source 322 to the mark current source 323. Then, the set value $I_{phCOMP}$ of the space current source 322 and the set value $I_{phDC}$ of the mark current source 323 in the phase adjustment region driving circuit 320 are calculated as follows (S07).

$$I_{phDC} = IphE$$

$$I_{phCOMP} = -\alpha * I_{opDIFF}$$

In this case, the modulation signal S9 (PHMD) is output so as to switch off the switch 324 when the recording space is formed and switch on the switch 324 when the recording mark is formed.

As described above, the compensation current Iph input to the phase adjustment region 302 is controlled. Thus, the heat generated between the active layer region 301 and the phase adjustment region 302 can be compensated without applying the multipulse modulation current to the phase adjustment region 302, and the compensation current to the phase adjustment region 302 can be suppressed to the requisite minimum. As a result, the plasma effect can be prevented.

In addition, the DBR region 303 is driven by the DBR region driving circuit 330. A current $I_{dbr}$ input to the DBR region 303 is set so that the oscillation wavelength of the wavelength tunable DBR semiconductor laser 300 may become almost the maximum conversion efficiency wavelength of the light waveguide type of QPM-SHG device by the operation unit 340.

The wavelength variation when the second harmonic is output from the SHG device 304 using the above driving device in the light source apparatus is analyzed using the model shown in FIGS. 17A to 17C. FIGS. 18A to 18F show a behavior of each part. FIG. 18A shows the driving current Iop to the active layer region, in which the current when the recording mark and the recording space are formed in the optical disc actually is input. FIG. 18B shows the compensation current Iph to the phase adjustment region, which is generated by the pulse average compensation method. FIG. 18C shows the wavelength variation Δλop caused by the heat generated by the input current Iop. FIG. 18D shows the wavelength variation Δλph1 caused by the heat generated by the compensation current Iph. FIG. 18E shows the wavelength variation Δλph2 caused by the plasma effect provided by the compensation current Iph. FIG. 18F shows a total wavelength variation caused by the driving current Iop and the compensation current Iph. It can be seen that the wavelength variation is suppressed to about ⅙ as compared with the wavelength variation shown in FIG. 8E. This is because the wavelength variation because of the plasma effect is prevented.

FIGS. 19A and 19B show the blue light power (second harmonic output) obtained as a result. FIG. 19C and FIG. 19D show the blue light power (second harmonic output) obtained by the complementary compensation method as a comparison. The blue light power (second harmonic output) is improved by 16% and the loss of the peak power is suppressed to 6% as compared with that of the complementary compensation method.

As described above, by using the driving device of the light source apparatus according to this embodiment of the present invention, the wavelength variation caused by the heat generation can be almost offset and the wavelength variation caused by the plasma effect can be suppressed to the minimum, so that a desired blue light power (second harmonic output) can be provided. As a result, recording can be performed to the high-density optical disc by applying the laser driving apparatus of the present invention to the optical disc apparatus.

By the driving device of the light source apparatus of this embodiment, the wavelength variation caused by the plasma effect can be suppressed to the minimum and the desired blue light power (second harmonic output) can be provided.

In addition, according to this embodiment, the second compensation current when the recording mark is formed is calculated based on the difference between the average value of the multipulse modulation currents and the bias current, input to the active layer region, and the relational equation Iph=$-\alpha$* (Iop)+$\beta$ founded by the inventors of the present invention. However, the present invention is not limited to the above case only. For example, a difference between a heat value when the multipulse modulation current is input and the heat value when the bias current is input, to the active layer region is calculated from the above difference, and the second compensation current may be calculated by adding the current corresponding to the difference of the heat values, to the first compensation current.

Furthermore, according to this embodiment, a description was made of the driving method and the driving device in the light source apparatus provided with the semiconductor laser and the second harmonic generation device for generating the second harmonic from the emitted light from the semiconductor laser. However, the present invention can be applied to a case where the emitted light from the semiconductor laser is used as it is. Thus, the present invention can be applied to a driving method and a driving device of the semiconductor laser. Still further, as described in this embodiment, in the case of the light source apparatus provided with the semiconductor laser and the second harmonic generation device, an effect of preventing the wavelength variation of the fundamental wave light which is the output light of the semiconductor laser according to the present invention can be very effectively provided.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

The present disclosure relates to subject matter contained in Japanese Application No. 2003-116837, filed on Apr. 22, 2003, the contents of which are herein expressly incorporated by reference in its entirety.

What is claimed is:

1. A driving method of a semiconductor laser having an active layer region, a phase adjustment region and a distributed Bragg reflector region, comprising the steps of:
   calculating an average value of multipulse modulation current modulated between a peak current and a bottom current input to said active layer region;
   calculating a difference between the average value of said multipulse modulation current and a bias current input to the active layer region;
   applying a first compensation current to said phase adjustment region when said bias current is input to said active layer region, and applying a second compensation current corresponding to said difference to said phase adjustment region when said multipulse modulation current is input to said active layer region.

2. The driving method of the semiconductor laser according to claim 1, wherein said second compensation current is calculated by adding a current corresponding to said difference to said first compensation current.

3. The driving method of the semiconductor laser according to claim 1, wherein a difference between a heat value when said multipulse modulation current is input and a heat value when said bias current is input to said active layer region is calculated from said difference, and
   said second compensation current is calculated by adding a current corresponding to the difference between said heat values, to said first compensation current.

4. A driving method of a light source apparatus provided with a semiconductor laser having an active layer region, a phase adjustment region and a distributed Bragg reflector region, and a second harmonic generation device for generating second harmonic from input light which was emitted from said semiconductor laser, comprising the steps of:
   calculating an average value of multipulse modulation currents modulated between a peak current and a bottom current input to said active layer region;
   calculating a difference between the average value of said multipulse modulation currents and a bias current input to the active layer region;
   applying a first compensation current to said phase adjustment region when said bias current is input to said active layer region, and applying a second compensation current corresponding to said difference to said phase adjustment region when said multipulse modulation current is input to said active layer region.

5. The driving method of the light source apparatus according to claim 4, wherein said second compensation current is calculated by adding a current corresponding to said difference to said first compensation current.

6. The driving method of the light source apparatus according to claim 4, wherein a difference between a heat value when said multipulse modulation current is input and a heat value when said bias current is input, to said active layer region is calculated from said difference, and
   said second compensation current is calculated by adding a current corresponding to the difference between said heat values to said first compensation current.

7. A driving apparatus of a semiconductor laser having an active layer region, a phase adjustment region and a distributed Bragg reflector region, comprising:
   an active layer driving means which applies a constant bias current and applies a multipulse modulation current modulated between a peak current and a bottom current, to said active layer region;
   a phase adjustment region driving means which applies a first compensation current to said phase adjustment region when said bias current is input to said active layer region, and applies a second compensation current to said phase adjustment region when said multipulse modulation current is input to said active layer region; and
   an operation unit which calculates an average value of said multipulse modulation currents input to said active layer region, calculates a difference between said bias current and said average value of the multipulse modulation currents input to said active layer region and calculates said first and second compensation currents applied to said phase adjustment region by said phase adjustment region driving means, based on said difference.

8. A semiconductor laser apparatus comprising:
   a semiconductor laser having an active layer region, a phase adjustment region and a distributed Bragg reflector region;

an active layer driving means which applies a constant bias current and applies a multipulse modulation current modulated between a peak current and a bottom current, to said active layer region;

a phase adjustment region driving means which applies a first compensation current to said phase adjustment region when said bias current is input to said active layer region, and applies a second compensation current to said phase adjustment region when said multipulse modulation current is input to said active layer region; and an operation unit which calculates an average value of said multipulse modulation currents input to said active layer region, calculates a difference between said bias current and said average value of the multipulse modulation currents input to said active layer region, and calculates said first and second compensation current applied to said phase adjustment region by said phase adjustment region driving means, based on said difference.

9. A light source apparatus comprising:

a semiconductor laser having an active layer region, a phase adjustment region and a distributed Bragg reflector region;

a second harmonic generation device for generating second harmonic from input light which is output from said semiconductor laser;

an active layer driving means which applies a constant bias current and applies a multipulse modulation current modulated between a peak current and a bottom current, to said active layer region;

a phase adjustment region driving means which applies a first compensation current to said phase adjustment region when said bias current is input to said active layer region, and applies a second compensation current to said phase adjustment region when said multipulse modulation current is input to said active layer region; and an operation unit which calculates an average value of said multipulse modulation currents input to said active layer region, calculates a difference between said bias current and said average value of the multipulse modulation currents, input to said active layer region, and calculates said first and second compensation currents applied to said phase adjustment region by said phase adjustment region driving means, based on said difference.

10. The light source apparatus according to claim 9, wherein said second harmonic generation device is quasi-phase matched with said semiconductor laser.

* * * * *